United States Patent
Shelnutt et al.

(10) Patent No.: US 10,010,013 B2
(45) Date of Patent: Jun. 26, 2018

(54) SCALABLE RACK-MOUNT AIR-TO-LIQUID HEAT EXCHANGER

(71) Applicant: DELL PRODUCTS, L.P., Round Rock, TX (US)

(72) Inventors: Austin Michael Shelnutt, Leander, TX (US); Travis C. North, Cedar Park, TX (US); Christopher M. Helberg, Austin, TX (US); Edmond I. Bailey, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 33 days.

(21) Appl. No.: 15/016,249

(22) Filed: Feb. 4, 2016

(65) Prior Publication Data
US 2017/0181322 A1 Jun. 22, 2017

Related U.S. Application Data

(60) Provisional application No. 62/270,571, filed on Dec. 21, 2015, provisional application No. 62/270,563, filed on Dec. 21, 2015.

(51) Int. Cl.
*H05K 7/20* (2006.01)
*H05K 7/14* (2006.01)

(52) U.S. Cl.
CPC ....... *H05K 7/20663* (2013.01); *H05K 7/1488* (2013.01); *H05K 7/207* (2013.01); *H05K 7/20554* (2013.01); *H05K 7/20627* (2013.01)

(58) Field of Classification Search
CPC ............ H05K 7/2079; H05K 7/20781; H05K 7/20836; H05K 7/20772; H05K 7/20809;
(Continued)

(56) References Cited

U.S. PATENT DOCUMENTS 5,758,607 A 6/1998 Brendel et al.
6,462,949 B1 10/2002 Parish et al.
(Continued)

OTHER PUBLICATIONS

Dravininkas, Adam, Non-Final Office Action, U.S. Appl. No. 15/049,074, The United States Patent and Trademark Office, dated Nov. 14, 2017.
(Continued)

*Primary Examiner* — Adam B Dravininkas
(74) *Attorney, Agent, or Firm* — Isidore PLLC

(57) ABSTRACT

An Information Handling System (IHS) includes at least one node provisioned with heat-generating components and an air passage that enables air to pass through the node and exit the node as exhaust air. An air-to-liquid heat exchanger (ATLHE) block is placed in a path of the exhaust air. The ATLHE block has an air directing structure, one or more air movers to move the exhaust air through the air directing structure, and an ATLHE. The ATLHE includes a liquid transfer conduit having at least one liquid supply port extending into a heat transfer section, which terminates into at least one liquid return port, the liquid transfer conduit enabling cooling liquid transfer through the ATLHE. A liquid cooling subsystem includes supply and return conduits. The supply conduit is sealably mated to the at least one supply port and the return conduit is sealably mated to the at least one return port.

20 Claims, 12 Drawing Sheets

(58) Field of Classification Search
CPC ........... H05K 7/20745; H05K 7/20827; H05K 7/20736; H05K 7/20763; H05K 7/20754; H05K 7/20218; H05K 7/20718; H05K 7/20627; H05K 7/20663; H05K 7/20554; H05K 7/207; H05K 7/1488; H01L 23/473; G06F 1/20; G06F 2200/201; G06F 1/206
See application file for complete search history.

(56) References Cited

U.S. PATENT DOCUMENTS

| | | | |
|---|---|---|---|
| 6,574,104 B2 | 6/2003 | Patel et al. | |
| 6,775,137 B2* | 8/2004 | Chu | H05K 7/20754 165/120 |
| 7,013,955 B2 | 3/2006 | Phillips et al. | |
| 7,106,590 B2 | 9/2006 | Chu et al. | |
| 7,403,384 B2 | 7/2008 | Pflueger | |
| 7,657,347 B2 | 2/2010 | Campbell et al. | |
| 7,963,119 B2 | 6/2011 | Campbell et al. | |
| 7,990,709 B2 | 8/2011 | Campbell et al. | |
| 8,387,249 B2 | 3/2013 | Campbell et al. | |
| 8,405,975 B2 | 3/2013 | Heiberg et al. | |
| 8,422,218 B2 | 4/2013 | Fried et al. | |
| 8,516,284 B2 | 8/2013 | Chan et al. | |
| 8,564,951 B1 | 10/2013 | Watanabe et al. | |
| 8,583,290 B2 | 11/2013 | Campbell et al. | |
| 8,797,740 B2 | 8/2014 | Campbell et al. | |
| 8,824,143 B2 | 9/2014 | Campbell et al. | |
| 8,842,433 B2 | 9/2014 | Koblenz et al. | |
| 8,934,244 B2 | 1/2015 | Shelnutt et al. | |
| 8,978,401 B2 | 3/2015 | Chainer et al. | |
| 9,045,995 B2 | 6/2015 | Graybill et al. | |
| 9,069,532 B2 | 6/2015 | Campbell et al. | |
| 9,250,636 B2 | 2/2016 | Chainer et al. | |
| 9,386,727 B2 | 7/2016 | Barringer et al. | |
| 9,496,200 B2 | 11/2016 | Lyon et al. | |
| 2004/0190247 A1* | 9/2004 | Chu | H05K 7/20754 361/696 |
| 2004/0221604 A1 | 11/2004 | Ota et al. | |
| 2005/0248922 A1 | 11/2005 | Chu et al. | |
| 2008/0067805 A1 | 3/2008 | Kamada et al. | |
| 2008/0232064 A1* | 9/2008 | Sato | H05K 7/20754 361/679.49 |
| 2008/0276639 A1 | 11/2008 | Stoddard | |
| 2009/0086428 A1* | 4/2009 | Campbell | H05K 7/2079 361/694 |
| 2009/0086432 A1* | 4/2009 | Campbell | H05K 7/20754 361/696 |
| 2009/0126909 A1 | 5/2009 | Ellsworth et al. | |
| 2009/0154096 A1* | 6/2009 | Iyengar | H05K 7/20754 361/694 |
| 2009/0165868 A1 | 7/2009 | Pearson | |
| 2009/0259343 A1 | 10/2009 | Rasmussen et al. | |
| 2009/0262501 A1 | 10/2009 | Claassen et al. | |
| 2010/0032142 A1 | 2/2010 | Copeland et al. | |
| 2010/0103614 A1 | 4/2010 | Campbell et al. | |
| 2010/0103618 A1 | 4/2010 | Campbell et al. | |
| 2011/0060470 A1 | 3/2011 | Campbell et al. | |
| 2011/0075373 A1 | 3/2011 | Campbell et al. | |
| 2011/0083621 A1 | 4/2011 | Dgunleye et al. | |
| 2011/0112694 A1 | 5/2011 | Bash et al. | |
| 2011/0313576 A1 | 12/2011 | Nicewonger | |
| 2012/0180979 A1 | 7/2012 | Harrington | |
| 2013/0098085 A1 | 4/2013 | Judge et al. | |
| 2013/0106265 A1 | 5/2013 | Shelnutt et al. | |
| 2013/0112378 A1 | 5/2013 | Shelnutt et al. | |
| 2013/0128455 A1 | 5/2013 | Koblenz et al. | |
| 2013/0229769 A1 | 9/2013 | Yang | |
| 2013/0264046 A1 | 10/2013 | Chainer et al. | |
| 2013/0312839 A1 | 11/2013 | Shelnutt et al. | |
| 2013/0312846 A1 | 11/2013 | Eriksen et al. | |
| 2013/0312854 A1 | 11/2013 | Eriksen et al. | |
| 2014/0202678 A1 | 7/2014 | Goth et al. | |
| 2014/0203550 A1 | 7/2014 | Utsch | |
| 2014/0218859 A1 | 8/2014 | Shelnutt et al. | |
| 2014/0321056 A1 | 10/2014 | Yoshikawa et al. | |
| 2014/0328562 A1 | 11/2014 | Pitwon | |
| 2015/0109735 A1 | 4/2015 | Campbell et al. | |
| 2015/0233597 A1 | 8/2015 | Dempster et al. | |
| 2015/0334878 A1 | 11/2015 | Long et al. | |
| 2016/0066480 A1 | 3/2016 | Eckberg et al. | |
| 2016/0242319 A1 | 8/2016 | Edwards et al. | |
| 2016/0242326 A1 | 8/2016 | Edwards et al. | |
| 2016/0366792 A1 | 12/2016 | Smith et al. | |
| 2017/0049009 A1 | 2/2017 | Steinke et al. | |
| 2017/0181322 A1 | 6/2017 | Shelnutt et al. | |
| 2017/0181323 A1 | 6/2017 | Shelnutt et al. | |

OTHER PUBLICATIONS

Suryawanshi, Suresh, Non-Final Office Action, U.S. Appl. No. 15/017,604, The United States Patent and Trademark Office, dated Dec. 22, 2017.

Suryawanshi, Suresh, Non-Final Office Action, U.S. Appl. No. 15/017,451, The United States Patent and Trademark Office, dated Dec. 14, 2017.

Suryawanshi, Suresh, Non-Final Office Action, U.S. Appl. No. 15/017,492, The United States Patent and Trademark Office, dated Nov. 3, 2017.

* cited by examiner

SCALABLE RACK-MOUNT AIR-TO-LIQUID HEAT EXCHANGER

PRIORITY

The present invention claims priority from each of the following provisional patent applications, with relevant content of each listed provisional application incorporated herein by reference: Provisional Application Ser. No. 62/270,563, with filing date Dec. 21, 2015; and Provisional Application Ser. No. 62/270,571, with filing date Dec. 21, 2015.

BACKGROUND

1. Technical Field

The present disclosure generally relates to information handling systems (IHS), and more particular to a direct-interface liquid cooled (DL) rack-configured IHS (RIHS). Still more particularly, the disclosure is related to removing heat from the DL RIHS using an air-to-liquid heat exchanger.

2. Description of the Related Art

As the value and use of information continue to increase, individuals and businesses seek additional ways to process and store information. One option available to users is an Information Handling System (IHS). An IHS generally processes, compiles, stores, and/or communicates information or data for business, personal, or other purposes, thereby allowing users to take advantage of the value of the information. Technology and information handling needs and requirements vary between different users or applications. IHSs may vary regarding what information is handled, how the information is handled, how much information is processed, stored, or communicated, as well as how quickly and efficiently the information is processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to convectionally transfer the heat from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, providing greater heat dissipation per node and requiring more directed cooling solutions. Extreme variations can exist in server/power/network topology configurations within an IT rack. In addition to dimension variations, the thermal requirements for heat-generating functional components for power, control, storage and server nodes can be very different between types or vary according to usage. These variations drive corresponding extreme diversity in port placement, fitting size requirements, mounting locations, and manifold capacity for a liquid cooling subsystem. Further, a chassis of each node is typically densely provisioned. Lack of space thus exists to mount a discrete water distribution manifold in high-power IT racks.

Thus, there is a continuing need for further innovations to provide directed cooling for the individual heat generating components, both at the individual node level, as well as at the larger rack level. When designing the cooling subsystem, consideration must also be given to the different form factors of IT nodes and rack heights of the RIHS, and the ability to effectively control cooling discretely (at device or node level) and generally across the overall RIHS.

As liquid cooling improves in efficiencies and performance, data center solutions continue to focus on implementing liquid cooling at the rack level for all components within the nodes.

BRIEF SUMMARY

The illustrative embodiments of the present disclosure provides an Information Handling System (IHS) includes at least one node provisioned with heat-generating components. The node has an air passage that enables air to pass through the node and exit the node as exhaust air. An air-to-liquid heat exchanger (ATLHE) block is placed in a path of the exhaust air. The ATLHE block has an air directing structure, one or more air movers to move the exhaust air through the air directing structure, and an air-to-liquid heat exchanger (ATLHE). The ATLHE includes a liquid transfer conduit having at least one liquid supply port extending into a heat transfer section. The heat transfer section terminates into at least one liquid return port. The liquid transfer conduit enables cooling liquid transfer through the ATLHE. A liquid cooling subsystem includes a supply conduit and a return conduit. The supply conduit is sealably mated to the at least one supply port and the return conduit is sealably mated to the at least one return port.

According to one aspect, the present disclosure provides an ATLHE block for use in a liquid cooled RIHS having at least one air-cooled node with heat generating components. The ATLHE block includes an air directing structure at a front portion of the ATLHE block. One or more air movers are positioned at a back section of the ATLHE block. The one or more air movers moves exhaust air through the air directing structure. An ATLHE has a cooling liquid transfer conduit configured with at least one liquid supply port for sealably mating with a supply side conduit of a liquid cooling supply subsystem. The supply port extends into a heat transfer section of conduit providing direct surface exposure to the exhaust air received into the air directing structure. The liquid transfer conduit terminates into at least one liquid return port for sealably mating with a return side conduit of the liquid cooling supply system. The liquid transfer conduit enables cooling liquid transfer through the ATLHE to absorb heat from the exhaust air directed through the ATLHE.

According to one aspect, a method is provided for assembling an IHS. In one or more embodiments, the method includes provisioning at least one node with heat-generating components in a node enclosure having an air passage that enables air to pass through the node and exit the node as exhaust air. The method includes placing in the path of the exhaust air an air directing structure of a ATLHE block having one or more air movers to move the exhaust air through the air directing structure and an ATLHE. The method includes connecting a supply conduit to at least one liquid supply port of a liquid transfer conduit of the ATLHE. The method includes sealably mating a supply conduit of a liquid cooling subsystem to at least one liquid supply port of a liquid transfer conduit of a heat transfer section of the ATLHE enabling cooling liquid transfer. The method includes sealably mating a return conduit of the liquid cooling subsystem to at least one liquid return port of the liquid transfer conduit of the heat transfer section of the ATLHE enabling cooling liquid return.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
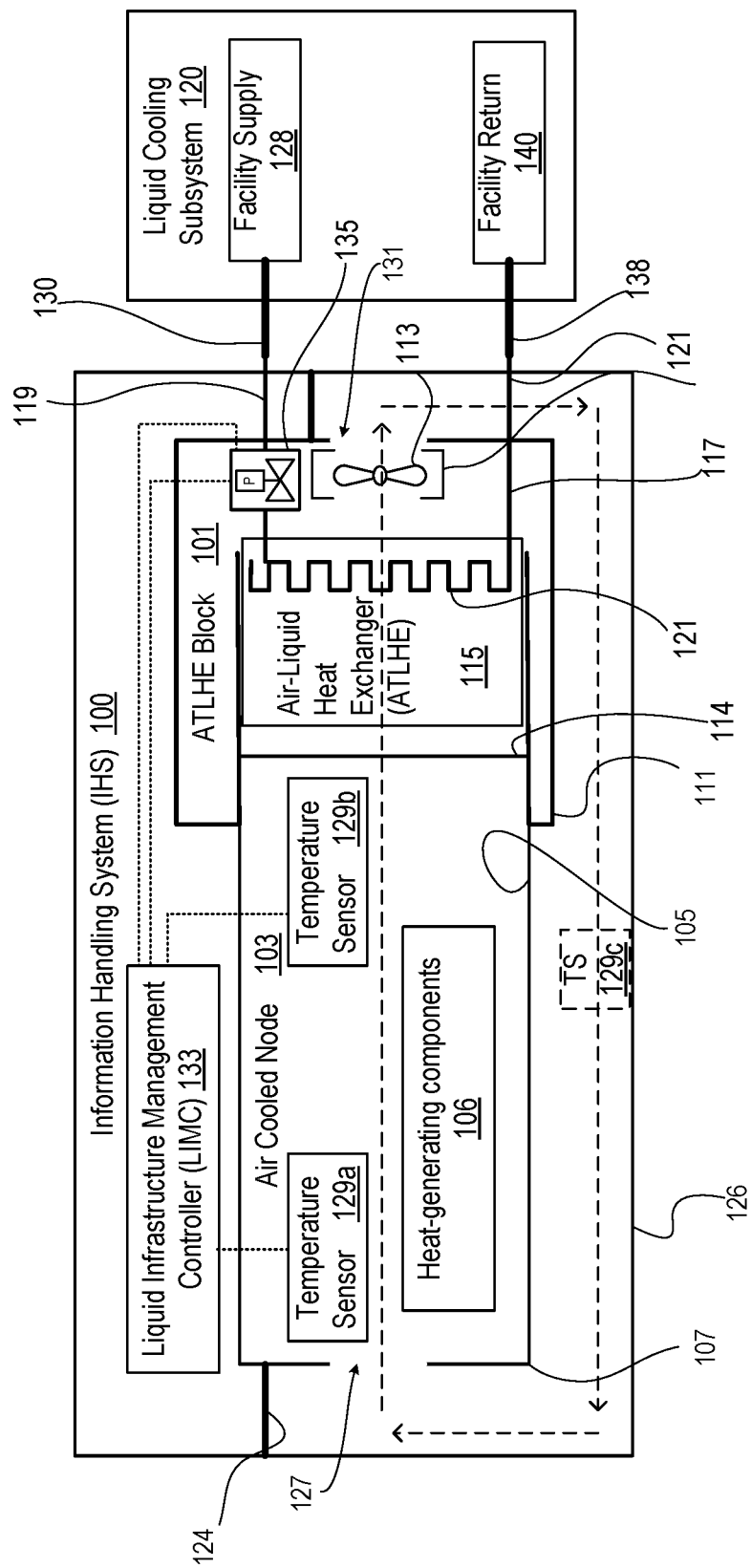
FIG. 1 illustrates a side perspective view of an internal layout/configuration of an example Information Handling System (IHS) having an air-cooled node, according to one or more embodiments.

The illustrative embodiments provide an Information Handling System (IHS) that includes at least one air-cooled node provisioned with heat-generating components and a ATLHE block for cooling the at least one air-cooled node. The node has an air passage that enables air to pass through the node and exit the node as exhaust air. A ATLHE block is placed in a path of the exhaust air. The ATLHE block has an air directing structure, one or more air movers to move the exhaust air through the air directing structure, and an air-to-liquid heat exchanger (ATLHE). The ATLHE includes a cooling liquid transfer conduit having at least one liquid supply port, extending to a heat transfer section that terminates into at least one liquid return port. A liquid cooling subsystem includes a supply conduit and a return conduit. The supply conduit is sealably mated to the at least one supply port and the return conduit is sealably mated to the at least one return port, enabling cooling liquid transfer through the ATLHE.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As utilized herein, the term "rack-configured" (as in RIHS) generally refers to the configuration of a large scale sever system within a physical rack having multiple chassis receiving rails for receiving specific sizes of information technology (IT) nodes, such as server modules, storage modules, and power modules. The term node generally refers to each separate unit inserted into a 1U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an information handling system (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As illustrated by the figures and described herein, multiple processing servers or server IHSs (referred to herein as server nodes) can be included within the single RIHS. Certain aspects of the disclosure then relate to the specific LC (sever or other) nodes and the functionality associated with these individual nodes or block-level groupings of nodes, while other aspects more generally relate to the overall DL RIHS containing all of the LC nodes.

As one design detail/aspect for the present innovation, consideration is given to the fact that extreme variations can exist in server/power/network topology configurations within an IT rack. In addition to dimension variations, the thermal requirements for heat-generating functional components for power, control, storage and server nodes can be very different between types or vary according to usage. The present disclosure addresses and overcomes the challenges with distributing liquid cooling fluids throughout an IT rack having nodes with a large number of variations in distribution components.

In addition to direct-interfacing of liquid cooling (via a system of conduits) to the primary heat generating components of the rack such as the processor, the present disclosure also includes additional consideration for cooling of secondary equipment and auxiliary components within the rack utilizing fluid-to-fluid heat exchanger methodology. Additionally, the present disclosure provides a modular approach to utilizing an air-to-liquid heat exchanger with quick connection and scalability to allow the solution to be scalable in both 1U and 2U increments.

FIG. 1 illustrates an Information Handling System (IHS) 100 that includes a ATLHE block 101 (illustrated as an assembled module having multiple components) that air cools at least one node 103. For clarity, FIG. 1 illustrates one node 103 that has an air passage 105 that enables air to pass through a node enclosure 107 of the node 103 and exit the node 103 as exhaust air. Node 103 is provisioned with heat-generating components 106 that are cooled by the air that passes through the air passage 105. The ATLHE block 101 is placed in a path of the exhaust air. The ATLHE block 101 includes an air directing structure 111 and one or more air movers 113 to move the exhaust air through the air directing structure 111. Node 103 includes an exhaust end 114 through which the exhaust air exits the node 103 and the ATLHE block 101 can be aligned in fluid communication with the exhaust end 114.

ATLHE block 101 includes an air-to-liquid heat exchanger (ATLHE) 115. ATLHE 115 can have a parallel set of flat or nonflat plate fins oriented to allow passage of exhaust air between the fins. The fins receive heat from liquid passages formed of a thermally conductive material. ATLHE block 101 also includes a liquid transfer conduit 117 having at least one liquid supply port 119, extending into heat transfer section 121, which terminates with at least one liquid return port 123. The supply port/s 119 and return port/s 123 of liquid transfer conduit 117 enables cooling liquid transfer from liquid cooling subsystem 120 through ATLHE 115. Liquid cooling subsystem 120 includes supply conduit 130 and return conduit 138. Supply conduit 130 is sealably mated to the at least one supply port 119 and return conduit 138 is sealably mated to the at least one return port 138. In one or more embodiments having an open-loop configuration, supply conduit 130 is ultimately connected with a facility supply 128 to provide cooling liquid. Return conduit 138 is ultimately connected with a facility return 140.

In one or more embodiments, an air-tight enclosure 126 having a return structure 124 that directs air from the air movers 113 of ATLHE block 101 to air intake 127 of node 103. In this embodiment, air-tight enclosure 126 recirculates exhaust air that has passed through and been cooled by ATLHE 115 back towards air passage 105 through node 101. Air-tight enclosure 126 forms a closed-loop air flow, which prevents (or substantially eliminates) intake of contaminants and particles from ambient air outside of the IHS 100. In this embodiment, the cooling liquid of the liquid cooling subsystem 120 absorbs and removes substantially all of the heat generated by the heat-generating components.

Temperature monitoring controls are provided to ensure that sufficient volume and flow rate of cooling liquid are provided to properly cool the exhaust air and maintain node 101 at a desired operating temperature (or within a desired operating temperature range). In one embodiment, the temperature and volume of cooling liquid from facility supply is determined based on measurements and testing and/or empirical calculations to provide adequate cooling for the operational requirements of the IHS 100. In one or more embodiments, at least the volume of the cooling liquid is dynamically controlled to more closely approximate the cooling requirements of IHS 100 and/or at least air-cooled node 101 at a given time. In the illustrative embodiment, first temperature sensor 129a is positioned to detect an air temperature of a selected one of an air intake 127 and air exhaust 131 of the node 103. Second temperature sensor 129b is positioned to detect an air temperature within the node 103. Liquid infrastructure management controller (LIMC) 133 is in communication with first and second temperature sensors 129a, 129b and with dynamic control valve 135 and LIMC 133 can dynamically adjust a volume of cooling liquid based at least in part on a difference between the detected air temperatures.

In at least one alternate embodiment, LIMC 133 is coupled to and receives the detected temperature readings from a node controller and/or a block controller that in turn is coupled to first temperature sensor and second temperature sensor 129. LIMC 133 and/or one of the other controllers generates a control signal that is sent to a pulse width modulation (PWM) circuit (not shown), which is coupled to dynamic control valve 135. In response to receipt of the control signal, PWM circuit in turn generates a PWM signal that can control the open position of dynamic control valve 135. The PWM signal adjusts the open position of dynamic control valve 135, and the open position of the valve determines (and can be used to regulate) the amount (or rate) of cooling liquid that flows through dynamic control valve 135 and into supply port 119 of liquid transfer conduit 117. For rack-level valve control, LIMC 133 triggers a specific value of the PWM signal based on a rack level determination that can include consideration of available (un-allocated or reclaimed) volume of liquid flow across the RIHS 100 and other factors. ATLHE block 101 can be configured as a single node ATLHE block or a block level ATLHE block supporting multiple adjacent air-cooled nodes within a block chassis of RIHS 100, and the flow control aspects described as being provided by LIMC 133 can also be provided by a block level controller, in one or more embodiments. Additional control features associated with the allocation of liquid flow to ATLHE block 101 are provided in related patent applications Nos. 15/017,604 and 15/017,451, whose content have been incorporated herein by reference.

Figure 2:
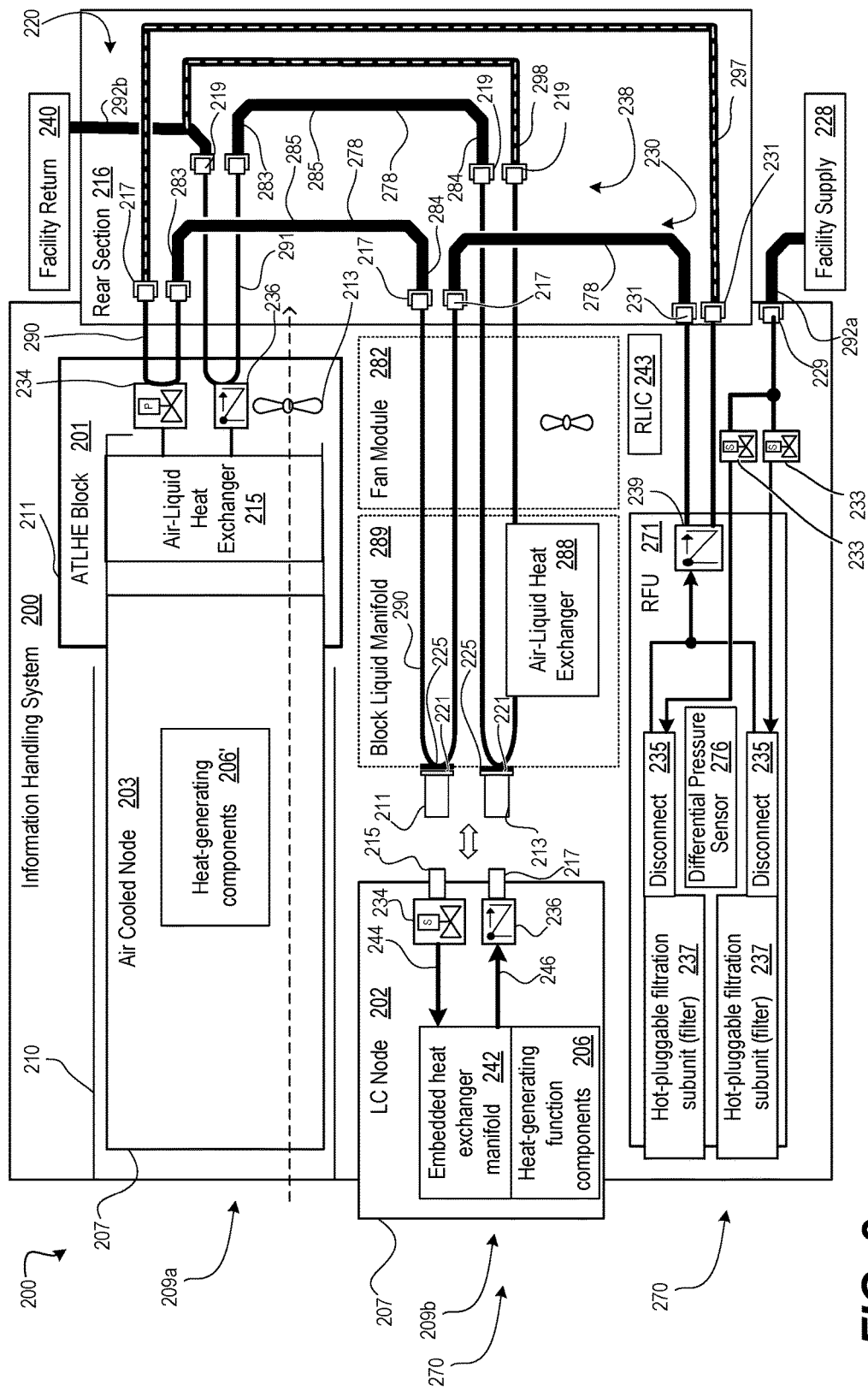
FIG. 2 illustrates a side perspective view of an internal layout/configuration of an example Direct-Interface Liquid-Cooled (DL) Rack Information Handling System (RIHS) having an air-cooled node and liquid cooled (LC) nodes, according to one or more embodiments.

FIG. 2 illustrates an example Direct-Interface, Liquid-cooled (DL) Rack Information Handling System (RIHS) 200 that includes an air cooled node 203. DL RIHS 200 utilizes a DL subsystem 220 that supports Liquid Cooled (LC) nodes 202 and the air cooled node 203 via a ATLHE block 201.

The air cooled node 203 includes heat generating components 206' that are cooled by air flow created by an air mover 213 of the ATLHE block 201. The air exhausted from a node enclosure 207 of the air cooled node 203 is absorbed and transferred by ATLHE 215 of the ATLHE block 201. The air cooled node 203 is inserted into a front bay of a chassis 210 in a node receiving slot 209a. The ATLHE block 201 is received in a rear section 216 of the rack 204. An air directing structure 211 closely positioned to the air cooled node 203 to receive the exhaust air. At least one liquid supply port 219 is connected to a supply rail conduit 230, and specifically to a modular liquid distribution (MLD) conduit 278. At least one liquid return port 123 is connected to a return rail conduit 238, and specifically to a MLD conduit 278. For clarity, FIG. 2 illustrates a single air cooled node 203 and a single LC node 202 that are connected via a pair of MLD conduits 278. The ATLHE block 201 includes a supply bypass tube 290 and a return bypass tube 291 that form part of a liquid rail 224 so that the ATLHE block 201 can only draw a portion of available cooling liquid.

Within DL RIBS 200, each LC node 202 includes chassis 210 received in a respective chassis-receiving bay 270 of rack 204. Each LC node 202 contains heat-generating functional components 206. Each LC node 202 is configured with a system of internal supply conduit 244 and return conduit 246, associated with embedded heat exchanger manifold 242. Embedded heat exchanger manifold 242 receives direct injection of cooling liquid to regulate the ambient temperature of LC node 202. A node-level dynamic control valve 234 and node-level return check valve 236 control an amount of normal flow and provide shutoff and/or otherwise mitigate a leak. Cooling subsystem 220 provides cooling to heat-generating functional components 206 inside the LC node 202 by removing heat generated by heat-generating functional components 206. Liquid rail 224 is formed from more than one node-to-node, MLD conduit 278 between more than one LC node 202 within in rack 204. MLD conduits 278 includes first terminal connection 283 and second terminal connection 284. First terminal connection 283 and second terminal connection 284 are attached on opposite ends of central conduit 285. Central conduit 285 is rack-unit dimensioned to directly mate and seal to and enable fluid transfer between a selected pair of rail supply ports 217 and/or rail return ports 219 of a selected LC node 202 and an adjacent LC node 202b.

The cooling subsystem 220 includes block liquid manifolds 289 mountable at a back side of the rack 204. Each block liquid manifold has at least one rail supply port 217 and at least one rail return port 219 on an outside facing side of the block liquid manifold 289. The at least one rail supply port 217 and the at least one rail return port 219 respectively communicate with at least one block supply port 221 and a block return port 223 on an inside facing side of the block liquid manifold 289. LC nodes 202 are insertable in receiving bays 270 of rack 204 corresponding to locations of the mounted block liquid manifolds 289. Block supply ports 221 and block return ports 223 of the LC nodes 202 and an inside facing portion of the corresponding block liquid manifold 289 are linearly aligned. The linear alignment enables direct sealing, for fluid transfer, of the lineally aligned inside manifold supply ports 225 and return ports 227 to the inside facing portion of the block liquid manifold 289. In one or more embodiments, block supply port 221 sealed to the internal manifold supply port 225 communicates via supply bypass tube 290 to two rail supply ports 217. Block return port 223 sealed to internal manifold return port 227 communicates via return bypass tube 291 of the respective block liquid manifold 289 to two rail return ports 219. Fan modules 282 mounted respectively onto back of block liquid manifold 289 have apertures to expose rail supply and return ports 217, 219. Additionally, fan modules 282 draw hot air from LC nodes 202 through an air-liquid heat exchanger 288 in block liquid manifold 289.

In one or more embodiments, supply liquid conduit 292a is attached for fluid transfer between facility supply 228 and rail supply port 217 of block liquid manifold 289 of RIHS 200. A return liquid conduit 292b can be attached for fluid transfer between rail return port 219 of block liquid manifold 289 to facility return 240. FIG. 2 further illustrates that the fluid connection to facility supply 228 includes RFU 271. To prevent contamination or causing damage to cooling subsystem 220, RFU 271 is received in bay 270 of rack 204 and includes input port 229 connected via supply liquid conduit 292a to facility supply 228. The RFU 271 includes output port 231 that is connected to MLD conduit 278 of supply rail conduit 230. Liquid rail 224 also includes return rail conduit 238. RFU 271 controls two external emergency shutoff valves 233 for flow received from the input port 229 that is provided respectively via hot-pluggable disconnects 235 to two replaceable filtration subunits ("filters") 237. The flow of cooling liquid flows in parallel to two replaceable filtration subunits 237, automatically diverting to the other when one is removed for replacing. Thereby, filtration and cooling of RIHS 200 can be continuous. Back-flow is prevented by check valve 239 that allows normal flow to exit to output port 231. Differential pressure sensor 276 measures the pressure drop across filters") 237 and provides an electrical signal proportional to the differential pressure. According to one aspect, a Rack Liquid Infrastructure Controller (RLIC) 243 can determine that one filter 237 is clogged if the differential pressure received from differential pressure sensor 276 falls below a pre-determined value. RLIC 243 can also be referred to as a Liquid Infrastructure Management Controller (LIMB).

In one or more embodiments, RIHS 200 can provide hot-pluggable server-level liquid cooling, an integrated leak collection and detection trough, and an automatic emergency shut-off circuit. At a block level, RIHS 200 can provide embedded air-to-liquid heat exchange, and dynamic liquid flow control. At a rack level, RIHS 200 can provide facility-direct coolant delivery, a scalable rack fluid network, a rack filtration unit, and automated rack flow balancing, and a service mode.

In one or more embodiments, each LC node 202 can receive liquid cooling service from a corresponding block liquid manifold 228 as illustrated by FIG. 2. In one or more embodiments, one or more block liquid manifolds 228 provide liquid cooling service to a block chassis 210 that in turn quick connects to more than one LC node 202. A node-receiving liquid inlet port 211 and a node-receiving liquid outlet port 213 are located at the rear section of one node-receiving slot 209b and positioned to be inwardly facing for blind mating to a node inlet and outlet ports 215, 217 of an LC node 202 inserted in the one node-receiving slot 209b. The system of internal supply conduit 244 and return conduit 246 supply cooling liquid through the node enclosure 207. An air-spring reducer conduit 203 is attached for fluid transfer to the internal supply conduit 244. The supply conduit 244 extends from a node inlet coupling 215, which in an exemplary embodiment is a male inlet coupling. The return conduit 246 terminates in a node outlet coupling 217, which in an exemplary embodiment is a male outlet coupling. The node inlet port 215 and the node outlet port 217 are positioned in an outward facing direction at a rear of the node enclosure 207. The node inlet port 215 and the node outlet port 217 are aligned to releasably seal to the respective inlet liquid port and outlet liquid port in the node-receiving slot 209a, 209b, for fluid transfer through the system of conduits 244, 246. A block supply plenum 274 and return plenum 275 can communicate for fluid transfer between the block liquid manifold 289 and each of the supported LC nodes 202. Modulation or shutoff of cooling liquid at the block level can also be incorporated into the block supply plenum 274 and return plenum 275. The liquid rail 224 can include alternate paths such as supply and return divert conduits 297, 298 that manually or automatically divert supply and return flow around a block liquid manifold 289 that is being serviced or replaced.

According to one embodiment, the liquid rail 224 can includes a series of secondary conduits, such as supply and return divert conduits that provides a by-pass fluid path for each of MLD conduits 278. In operation, divert conduit allows for the removal of corresponding MLD conduit 278, thus removing the flow of cooling liquid to the particular block of nodes, without interrupting the flow of cooling liquid to the other surrounding blocks of computer gear. For example, a particular MLD conduit 278 can be replaced due to a leak. For another example, a block liquid manifold 289 can be replaced. The inclusion of divert conduits thus enables rapid servicing and maintenance of block liquid manifold 289 and/or nodes within block chassis without having to reconfigure the MLD conduits 278. In addition, the RIHS 200 can continue operating as cooling liquid continues to be provided to the remainder of the blocks that are plugged into the liquid rail 224. Re-insertion of the MLD conduit 278 then reconnects the flow of cooling liquid to the block for normal cooling operations, and shuts off the diverted flow of cooling liquid. In an exemplary embodiment, the MLD conduits 278 provide a quick disconnect feature that interrupts flow when not fully engaged to a respective port. Disconnection of an MLD conduit 278 interrupts flow in a primary portion of the liquid rail 224 for either supply or return, shifting flow through one or more divert conduits to provide cooling liquid to the other block liquid manifolds 289. In one or more embodiments, a manual or active shutoff valve can interrupt flow on either or both of the primary or divert portions of the liquid rail 224.

Figure 3:
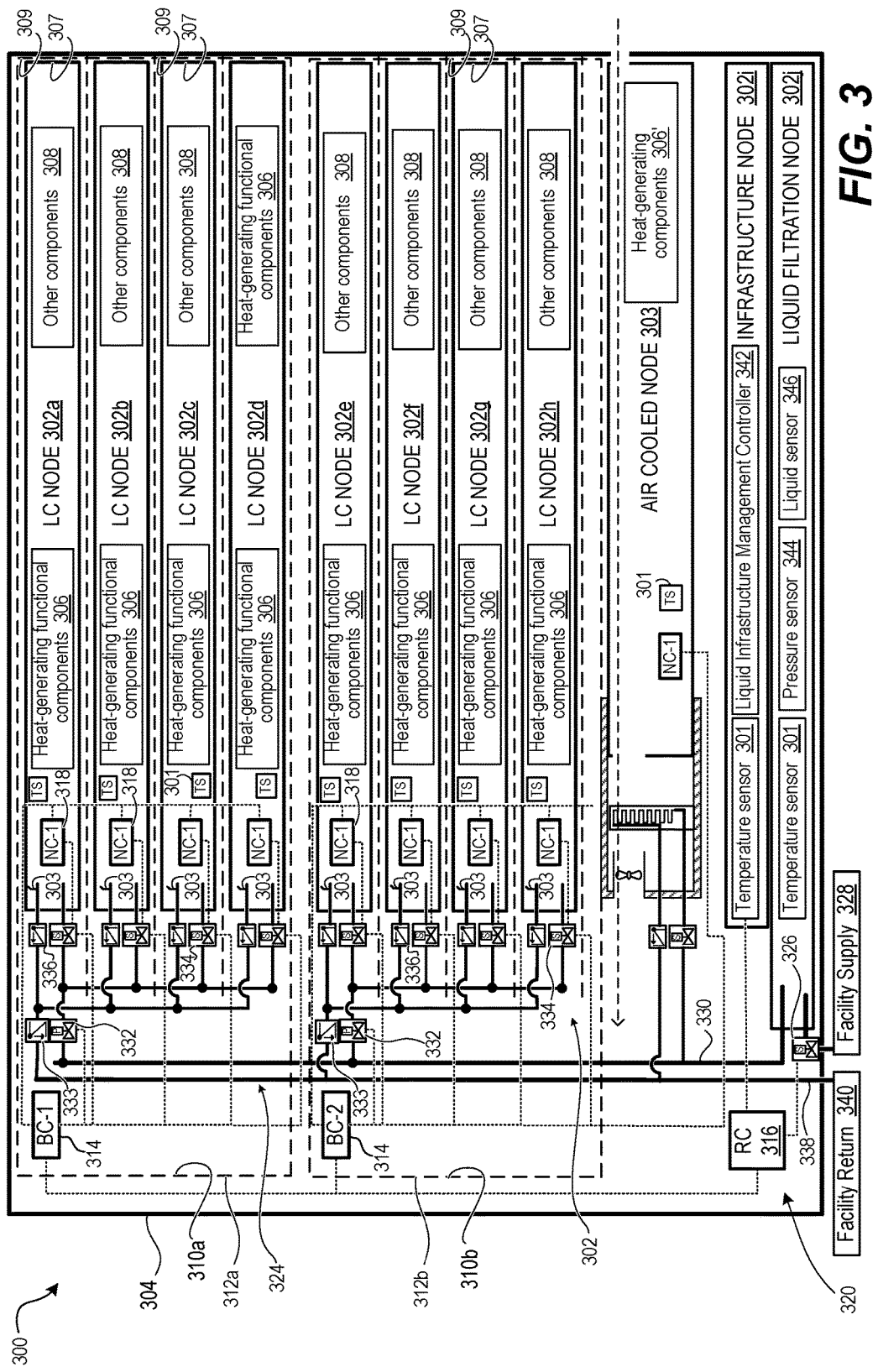
FIG. 3 illustrates a detailed block diagram of a DL RIHS configured with LC nodes arranged in blocks and which are cooled in part by a liquid cooling system having a rail comprised of MLD conduits, and in part by a subsystem of air-liquid heat exchangers, according to multiple embodiments.

FIG. 3 depicts an illustrative example of LC nodes 302a-302j (collectively refer to as nodes 302), with each nodes 302a-302h including heat-generating functional components 306. Additionally, RIHS 300 also includes an infrastructure node 302j and liquid filtration node 302k, which do not necessarily include heat-generating functional components 306 that require liquid cooling, as the other LC nodes 302a-302h. In the illustrative embodiments, nodes 302a-102b, and 302e-302h include other components 308 that are not necessarily heat generating, but which are exposed to the same ambient heat conditions as the heat generating components by virtue of their location within the node. In one embodiment, these other components 308 can be sufficiently cooled by the direct-interfacing liquid cooling applied to the node and/or using forced or convective air movement, as described later herein. Each node 302 is supported and protected by a respective node enclosure 307. Nodes 302a-302d are further received in node receiving bays 309 of a first block chassis 310a of a first block 312a. Nodes 302e-302h are received in a second block chassis 310b of a second block 312b. In the illustrative embodiments, the nodes 302 are vertically arranged. In one or more alternate embodiments, at least portions of the nodes 302 (and potentially all of the nodes) may also be arranged horizontally while benefiting from aspects of the present innovation.

The present innovation is not limited to any specific number or configuration of nodes 302 or blocks 312 in a rack 304. According to one aspect, nodes 302 can be of different physical heights of form factors (e.g., 3U, 3.5U, 2U), and the described features can also be applied to nodes 302 having different widths and depths (into the rack), with some extensions made and/or lateral modifications to the placement of cooling subsystem conduits, as needed to accommodate the different physical dimensions. As a specific example, air cooled node 303 is depicted as having a larger node enclosure 307' (with corresponding different dimensions of heat-generating functional components 306') of a different number of rack units in physical height (e.g., 2U) that differs from the heights (e.g., 3U) of the other nodes 302a-102h and 302i-302j. RIHS 300 can include blocks 312 or nodes 302 selectably of a range of discrete rack units. Also, different types of IT components can be provided within each node 302, with each node possibly performing different functions within RIHS 300. Thus, for example, a given node 302 may include one of a server module, a power module, a control module, or a storage module. In a simplest configuration, the nodes 302 can be individual nodes operating independent of each other, with the RIHS 300 including at least one rack-level controller (RC) 316 for controlling operational conditions within the RIHS 300, such as temperature, power consumption, communication, and the like. Each node 302 is then equipped with a node-level controller (NC) 318 that communicates with the rack-level controller 316 to provide localized control of the operational conditions of the node 302. In the more standard configuration of a DL RIHS 300, and in line with the described embodiments, RIHS 300 also includes block-level controllers (BCs) 314, communicatively coupled to the rack-level controller 316 and performing block-level control functions for the LC nodes within the specific block. In this configuration, the nodes 302 are arranged into blocks 312, with each block 312 having one or more nodes 302 and a corresponding block-level controller 314. Note the blocks do not necessarily include the same number of nodes, and a block can include a single node, in some implementations.

A Direct-Interface Liquid Cooling (DL) subsystem (generally shown as being within the RIHS and labelled herein as 320) provides liquid cooling to heat-generating functional components 306 via a liquid rail 324 under the control of the rack-level controller 316, block-level controllers 314, and/or node-level controllers 318, in a plurality of alternate embodiments. Rack-level controller 316 controls a supply valve 326, such as a solenoid valve, to allow cooling liquid, such as water, to be received from a facility supply 328. The cooling liquid is received from facility supply 328 and is passed through liquid filtration node 302l before being passed through supply conduit 330 of liquid rail 324. Each block 312a, 312b receives a dynamically controlled amount of the cooling liquid via block-level dynamic control valve 332, such as a solenoid valve. The individual needs of the respective nodes 302a-302d of block 312a can be dynamically provided by respective node-level dynamic control valves 334, controlled by the block-level controller 314, which control can, in some embodiments, be facilitated by the node-level controllers 318. In addition to allocating cooling liquid in accordance with cooling requirements (which can be optimized for considerations such as performance and economy), each of the supply valve 326 and/or dynamic control valves 332, 334 can be individually closed to mitigate a leak. A check valve 336 is provided between each node 302a-302i and 303 and a return conduit 338 of the liquid rail 324 to prevent a backflow into the nodes 302a-302i and 303. The return conduit 338 returns the cooling liquid to a facility return 340.

To support the temperature control aspects of the overall system, RIHS 300 includes temperature sensors 301 that are each located within or proximate to each node 302a-102j, with each temperature sensor 301 connected to the node-level controller 318 and/or the corresponding block-level controller 314. Temperature sensors 301 operate in a feedback control loop of the liquid cooling subsystem 322 to control the amount of liquid flow required to cool the nodes 302a-302j. In one or more embodiments, the rack-level controller 316 can coordinate performance constraints to block-level controllers 314 and/or node-level controllers 318 that limit an amount of heat generated by the heat-generating functional components 306 to match a heat capacity of the flow of cooling liquid in liquid-rail-cooling (LRC) subsystem 322. Alternatively or in addition, the rack-level controller 316 can coordinate cooling levels to block-level controllers 314 and/or node-level controllers 318 that in turn control the dynamic control valves 332, 334 for absorption and transfer of the heat generated by the heat-generating functional components 306 by the DL subsystem 322. In one or more embodiments, support controllers such as a Liquid Infrastructure Management Controller (LIMC) 342 can perform management and operational testing of DL subsystem 322. LIMC 342 can monitor pressure sensors 344 and liquid sensors 346 to detect a leak, to validate operation of a dynamic control valves 332, 334 or shut-off valves such as supply valve 326. LIMC 342 can perform close-loop control of specific flow rates within the RIHS 300.

The present disclosure provides a modular approach of a ATLHE block that incorporates an ATLHE with quick connection. The ATLHE block can be scalable in 1U, 1.5U, 2U, 4U, etc. rack unit increments and support 19 inch Information and Communication Technology (ICT) racks as well as 21 and 23 inch telecom racks with expander brackets. Hot air from auxiliary components is pushed through the ATLHE of the ATLHE block and the resulting energy is absorbed and transferred by cooling liquid of an ICT fluid network. The absorbed and transferred heat can be rejected to a facility cooling loop. Examples of auxiliary components that generate heat can include server nodes, information technology nodes, storage nodes, power nodes, and infrastructure nodes. Transfer of cooling liquid can be passively caused by facility supply pressure or actively moved depending on the location of the ATLHE block. Control of the active version can be facilitated by Power Distribution Unit (PDU) output power as well as the fluid sensible energy rise. An imbalance of power consumes can drive system fans higher or lower corresponding to thermal requirements.

Figure 4:
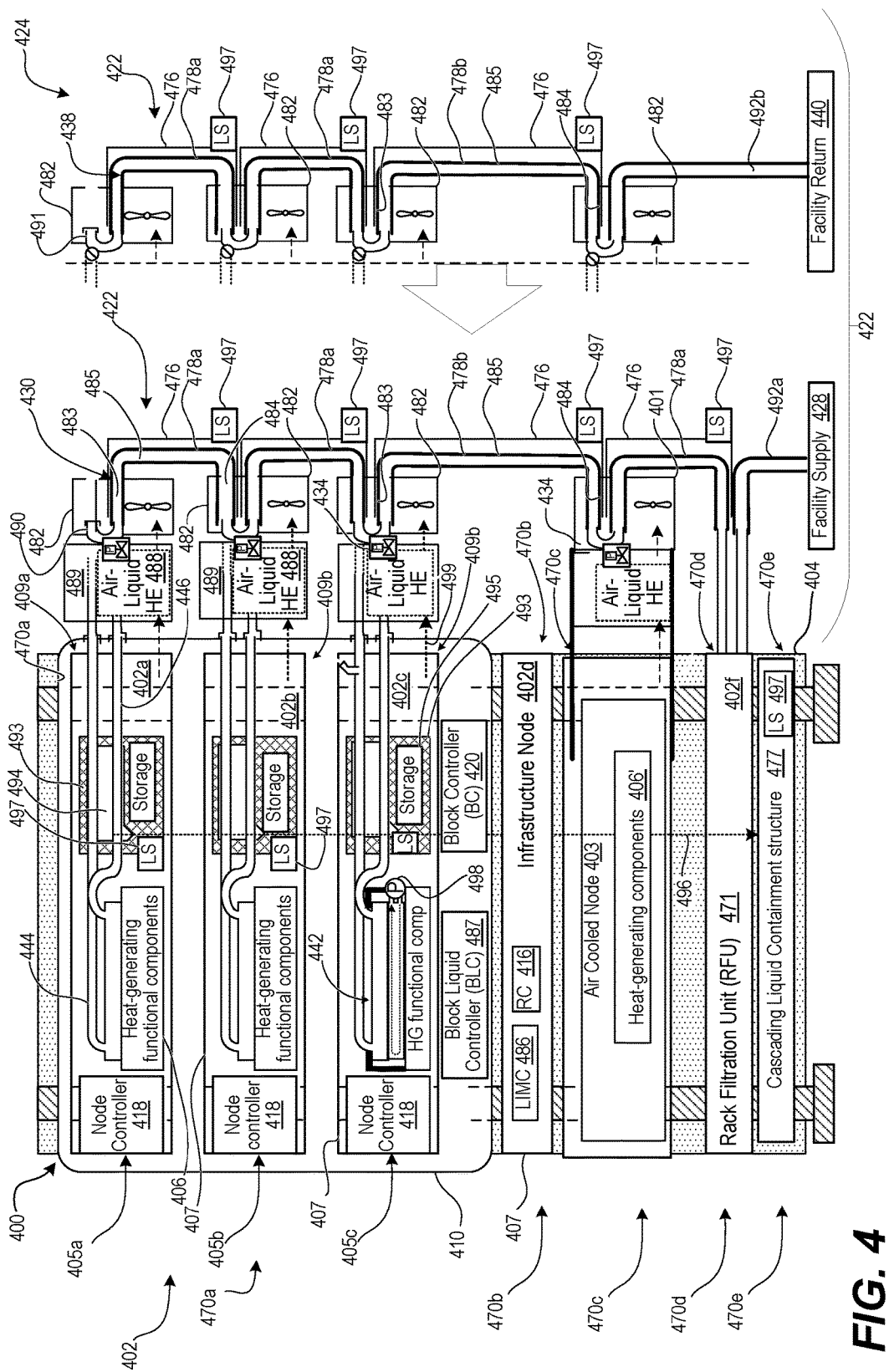
FIG. 4 illustrates an expanded, more detailed view of the liquid interconnection between the node level heat exchange manifold, the block liquid manifold containing the air-liquid heat exchanger, and example MLDs of the liquid rail, according to multiple embodiments.

FIG. 4 illustrates a more detailed view of the interconnections of the liquid cooling subsystem, at a node level and rack level within an example DL RIHS 400. As shown, RIHS 400 is configured with LC nodes 402a-402d arranged in blocks (e.g., block 1 comprising 402a-802c) and which are cooled in part by a liquid cooling subsystem having a liquid rail comprised of MLD conduits, and in part by a subsystem of air-liquid heat exchangers, can be configured with heat-generating functional components 406 and that are cooled at least in part by a system of MLD conduits 478a-478b, according to one or more embodiments. Illustrated within nodes 402 are heat-generating functional components 406, such as processors, voltage regulators, etc., which emit heat during operation and or when power is applied to the component, such that the ambient temperature increases around the component, and within the node, and eventually within the block, and ultimately DL RIHS 400, during standard operation. To mitigate heat dissipation (and effects thereof), and to maintain the RIHS, block, node, and functional components within proper operating temperatures, DL RIHS 400 is configured with a direct-interface liquid-cooling (DL) subsystem 422. DL subsystem 422 includes a rack level network of liquid propagating pipes, or conduits that are in fluid communication with individual node level networks of liquid propagating conduits. Additionally, DL subsystem 422 collectively facilitates heat absorption and removal at the component level, the node level, the block level, and/or the rack level. The rack-level network of conduits includes a modular arrangement of a liquid rail 424 formed by more than one node-to-node MLD conduit 478a-478b spanning (or extending) between LC nodes 402 and an air cooled node 403 provisioned in rack 404.

At the top position of RIHS 400, a block chassis 410 is received in a block chassis receiving bay 470a of rack 404. Within block chassis 410, a first node 402a received in a first node receiving bay 409a of the rack 404 has a vertical height of one rack unit (1U). A rack unit, U or RU as a unit of measure, describes the height of electronic equipment designed to mount in a 19-inch rack or a 13-inch rack. The 19 inches (482.60 mm) or 13 inches (584.20 mm) dimension reflects the horizontal lateral width of the equipment mounting-frame in the rack including the frame; the width of the equipment that can be mounted inside the rack is less. According to current convention, one rack unit is 1.75 inches (44.45 mm) high. A second node 402b received in a second node receiving bay 409b of the rack 104 (of FIG. 1) has a vertical height of 1U. A third node 402c received in a third node receiving bay 409c of the rack 404 has a vertical height of 1U. A fourth node 402d, infrastructure node 402b, is received in a second block chassis receiving bay 470b of rack 404 and has a vertical height of 1U. Infrastructure node 402b can contain functional components such as a rack-level controller 416. A fifth node 403 is received in a third chassis receiving bay 470c and has a vertical height of 4U and is an air cooled node 403 with a ATLHE block 401. A sixth node 402e, which provides a Rack Filtration Unit (RFU) 471, is received in a fourth block chassis receiving bay 470d of the rack 404. Infrastructure node 402 and RFU 471 are examples of nodes 402 that may not require liquid cooling. A cascading liquid containment structure 477 is received in a fifth chassis receiving bay 470e and includes liquid sensor 497.

MLD conduits 478a of 1U can be used to connect nodes of 1U vertical spacing. Because of the additional 1U separation of LC nodes 402c and air cooled node 403 by inclusion of infrastructure node 402d, MLD conduit 478b between the third and fifth nodes 402c-402d is dimension 4U to accommodate the increased spacing. MLD conduits 478a-478b can thus support different heights (1U to NU) of IT components.

Each MLD conduit 478a-478b includes first and second terminal connections 483, 484 attached on opposite ends of central conduit 485 that is rack-unit dimensioned to seal to a port of LC node 402 and enable fluid transfer between a port of a selected LC node 402 and a port of an adjacent LC node 402. In FIG. 4, facility supply 428 and facility return 440 are respectively located at the intake end of liquid rail 424 and the exhaust end of liquid rail 424. The actual location of facility supply 428 and facility return 440 can be reversed. Alternatively, facility supply 428 and facility return 440 can be located above the RIHS 400 or both conduits can be located on opposite sides of the RIHS 400 in alternate embodiments.

Liquid cooling subsystem 422 includes a liquid infrastructure manager controller (LIMC) 486 which is communicatively coupled to block liquid controllers (BLCs) 487 to collectively control the amount of cooling liquid that flows through the RIHS 400 and ultimately through each of the nodes 402 in order to effect a desired amount of liquid cooling at the component level, node level, block level, and rack level. For clarity, LIMC 486 and BLCs 487 are depicted as separate components. In one or more embodiments, the liquid control features of the LIMC 486 and BLCs 487 can be incorporated into one or more of the rack-level controller 416, block-level controllers 420, and the node-level controllers 418. As illustrated in FIG. 1 and previously described, each of the LIMC 486 and BLCs 487 are connected to and respectively control the opening and closing of flow control valves that determine the amount of flow rate applied to each block and to each node within the specific block. During cooling operations, one of LIMC 486 and BLC 487 causes a specific amount of liquid to be directly injected into the intake conduits of the LC node 402, which forces the cooling liquid through the system of conduits within the LC node 402 to the relevant areas and/or functional components/devices inside the nodes 402 to absorb and remove heat away from the inside of the node and/or from around the components within the node.

As another aspect, the present disclosure provides a modular approach to utilizing air-to-liquid heat exchanger 488 with quick connection and is scalable in both 1U and 4U increments. In one or more embodiments, DL cooling subsystem 422 can include a plurality of air-to-liquid (or liquid-to-air) heat exchangers 488 that facilitate the release of some of the heat absorbed by the exhaust liquid to the surrounding atmosphere around the RIHS 100 (of FIG. 1). Air-to-liquid heat exchangers 488 can be integral to block liquid manifold 489 that, along with the MLD conduits 478a-478b, form scalable liquid rail 424. One aspect of the present disclosure is directed to providing scalable rack-mounted air-to-liquid heat exchanger 488 for targeted heat rejection of rack-mounted equipment to DL cooling subsystem 422. Hot air 499 from auxiliary components, such as storage device 495, would be pushed through the air-to-liquid heat exchanger 488, and the resulting energy would transfer to liquid rail 424 and be rejected to a facility cooling loop, represented by the facility return 440.

RIHS 400 can include variations in LC node 402 that still maintain uniformity in interconnections along liquid rail 424 formed by a chassis-to-chassis modular interconnect system of MLD conduits 478a-478b. With this scalability feature accomplished using MLD conduits 478a-478b, cooling subsystem 422 of the RIHS 400 allows each block chassis 410 to be a section of a scalable manifold, referred herein as liquid rail 424, eliminating the need for a rack manifold. The scalability of liquid rail 424 enables flexible configurations to include various permutations of server and switch gear within the same rack (rack 404). MLD conduits 478a-478b can comprise standardized hoses with sealable (water tight) end connectors. Thus, the rack liquid flow network can encompass 1 to N IT chassis without impacting rack topology, space constraints, and without requiring unique rack manifolds. Additionally, according to one aspect, the MLD conduits are arranged in a pseudo daisy chain modular configuration, which allows for unplugging of one MLD conduit from one rack level without affecting liquid flow to and cooling of other rack levels.

The system of conduits extending from node intake valve 434 into each LC node 402 enables each LC node 402 to engage to block liquid manifold 489. Block chassis 410 or node enclosure 407 of each LC node 102 provides the intake and exhaust conduit connections to engage to respective terminals of MLD conduits 478a-478b within the MLD network provided by liquid rail 424. For example, where nodes 402 are designed as sleds, node enclosure 407 would be a sled tray, and each block would then include more than one sled tray received into block chassis 410, forming the extensions of block liquid manifold 489. Alternatively, the node enclosure 407 can be a single node chassis such as one of nodes 402c-402f.

Supply and return bypass tubes 490, 491 of each block liquid manifold 489 are connected by MLD conduits 478a-478b to form supply rail conduit 430 and return rail conduit 438. For clarity, FIG. 4 illustrates the return rail conduit 438 separately. Liquid rail 424 enables multiple types of devices to be coupled together, each receiving an appropriately controlled portion of cooling liquid capacity. In one embodiment, liquid cooling subsystem 422 is passively pressurized by attaching MLD supply conduit 492a to facility supply 428 and an MLD return conduit 492b to facility return 440. Liquid flow from supply rail conduit 430 to return rail conduit 438 of liquid rail 424 can be controlled based upon factors such as a temperature of the liquid coolant, detected temperature within LC nodes 402, air temperature inside or outside of DL RIHS 400, etc.

In an exemplary embodiment, the scalable rack manifold provided by liquid rail 424 is formed in part by MLD conduits 478a-478b that run vertically in the back of the RIHS 400 with quick disconnects on the front and rear face of block liquid manifold 489 that allows for IT/infrastructure equipment respectively to be plugged into both front and back sides of the block liquid manifold 489. For example, LC nodes 402, such as server modules, can plug into the front side and fan modules 482 can plug onto the back side of block liquid manifold 489. This also allows for other liquid cooled devices such as LC Power Distribution Units (PDUs) to be plugged into the cooling liquid supply rail conduit 430 and return rail conduit 438 of liquid rail 424. Thereby, a rack hot pluggable cooling interface is created for any rack-mounted equipment.

Cooling subsystem 422 can support an embedded liquid-to-liquid heat exchanger manifold 442, such as in LC node 402c. Node liquid-to-liquid heat exchangers are provided for rejecting heat from one fluid source to a secondary source. One aspect of the present disclosure solves the problems that many shared-infrastructure IT systems (e.g., blade chassis) do not have adequate space to accommodate a liquid-to-liquid heat exchanger. Unlike with generally-known systems that rely upon liquid heat transfer having to exchange heat with an external liquid-to-liquid heat exchanger, the present disclosure enables on-rack liquid-to-liquid heat exchanger that does not require any of the vertical chassis space. Additionally, the present disclosure provides these benefits without requiring a central distribution unit (CDU), which takes up datacenter floor space. One aspect of the present disclosure provides embedded heat exchanger manifold 442 having a common heat transfer plate and a shared bulk header to create a combined liquid distribution manifold that includes a secondary liquid coolant for absorbing heat through the shared bulk header. In particular, the combined embedded heat exchanger manifold 442 rejects heat within shared node enclosure 407 such as node 402c to a secondary liquid coolant. Internal node supply 444 and return conduits 446 of a manifold built on top of a heat exchanger core allow heat transport within manifold 442. In one embodiment, closed system pump 498 can use a first coolant to cool a high thermal energy generating functional component such as a CPU or voltage regulator.

Additionally, the liquid cooling subsystem 422 also includes a filtration system or unit 471, which prevents chemical impurities and particulates from clogging or otherwise damaging the conduits as the fluid passes through the network of conduits. According to one aspect of the disclosure, liquid cooling subsystem 422 provides RFU 471 in fluid connection with the intake pipes from facility supply 428. In at least one embodiment, RFU 471 includes a sequenced arrangement of liquid filters within a full-sized sled that can be removably inserted by an end user into one of the receiving slots of rack 404. In one embodiment, the RFU 471 is located on an infrastructure sled having rack-level controllers and other rack-level functional components. In at least one embodiment, the entirety of the sled is filed with components associated with RFU 471. Thus, it is appreciated that the RFU 471 may occupy the entire area of one vertical slot/position within the chassis. Alternate locations of the RFU 471 can also be provided, in different embodiments, with an ideal location presenting the intake port of the RFU 471 in close proximity to a connection to facility supply 428 to directly receive the facility supply 428 prior to the liquid being passed into the remainder of the conduits of the liquid cooling subsystem 422. It is appreciated that if the system was capable of completing all heat exchange within the rack, then sealing the rack would be feasible and would reduce and/or remove any requirements for filtration and/or allocation of rack space for RFU 471.

Liquid cooled compute systems use the high heat transport capacity of water. However, the disclosure recognizes and addresses the fact that with liquid introduced into an electronic enclosure, there is a potential for leaks that can cause catastrophic system failure. Also, in some instances, a leak can create an electronic short with a resulting exothermal reaction causing permanent damage to the DL RIHS 400. To mitigate such risks, as one design feature, node-level carrier 493 can include a trench/gutter system for use as liquid containment structure 494. In one embodiment, the gutter system can also incorporate an absorbent material that can accumulate sufficient amounts of liquid from small leaks to enable external sensing of the leak. Advantageously, the carrier 493 can also be thermally conductive to serve as a heat sink for components such as storage devices 495. In one embodiment, another leak detection solution that can be incorporated into the LC node 402 involves use of a solenoid to create an event when additional current is applied, due to water pooling around the solenoid. Barriers on carrier 493 can be specifically designed to contain a liquid leak and assist in funneling the liquid through the gutter system. Liquid rail 424 can also be provided with leak containment and detection. In one or more embodiments, removable pipe covers 476 are sized to be mounted around respective MLD conduits 478a-478b and can include liquid sensors 497 for automatic alerts and shutdown measures.

In one or more embodiments, DL RIHS 400 further incorporates a node-level liquid containment structure 490 with a cascading drain runoff tubing network 496 to a rack-level cascading liquid containment structure 494. In one or more embodiments, the DL RIHS 400 further incorporates leak detection response such as partial or complete automated emergency shutdown. Liquid sensors (LS) 497 at various cascade levels can identify affected portions of DL RIHS 400. Containment and automatic shutoff can address the risks associated with a leak developing in the DL cooling system 422.

FIGS. 5-8 illustrate different exterior and rear views of an example assembled DL RIHS 500. DL RIHS 500 includes rack 504, which is a physical support structure having an exterior frame and attached side panels to create cabinet enclosure 506 providing interior chassis receiving bays (not shown) within which a plurality of individual node chasses (or sleds) 502 (FIG. 5) of functional IT nodes, such as LC node 202, 302, 402 of FIGS. 2-4, are received. In the description of the figures, similar features introduced in an earlier figure are not necessarily described again in the description of the later figures.

Figure 6:
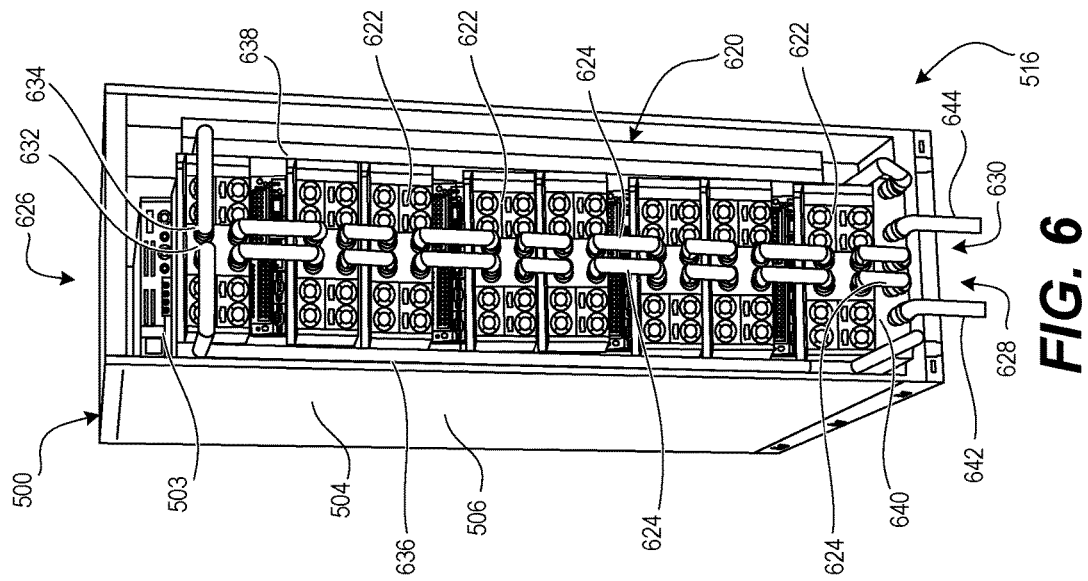
FIG. 6 illustrates a back perspective view of the example DL RIHS of FIG. 5 having an air-cooled node, according to one or more embodiments.
Figure 5:
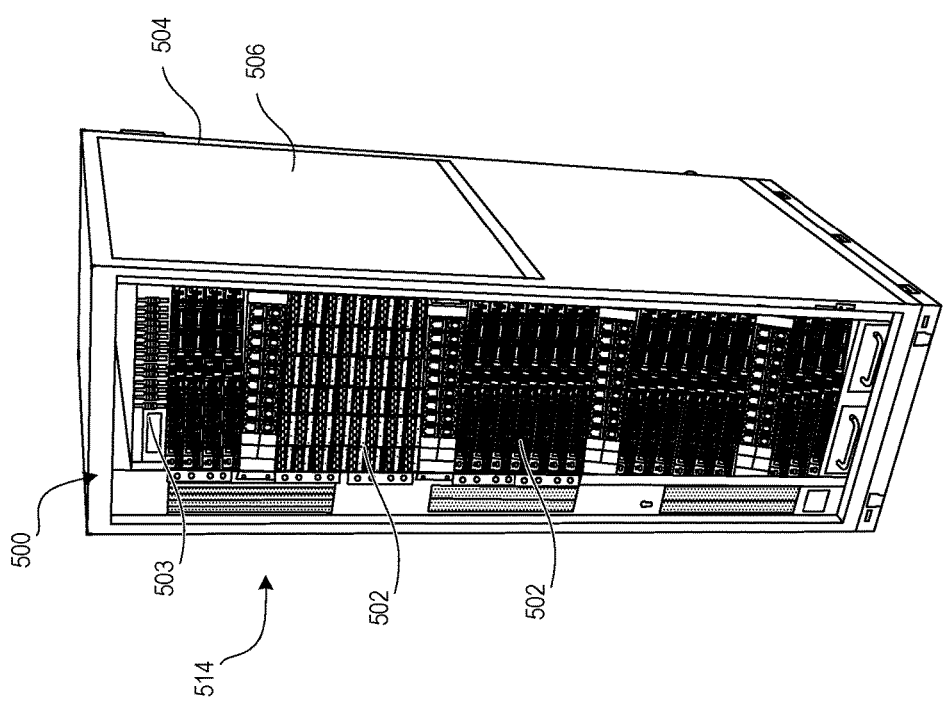
FIG. 5 illustrates a front perspective view of an example DL RIHS having an air-cooled node, according to one or more embodiments.

As illustrated, rack 504 includes opposing side panels 508, attached to a top panel 510 (and bottom panel—not shown) to create the main cabinet enclosure 506 that includes multiple chassis receiving bays for housing LC nodes 502 and/or air cooled nodes 503. The created cabinet enclosure 506 includes a front access side 512 (FIG. 5) and a rear side 514 (FIG. 6). The front access side 512 provides access to the chassis receiving bays 516 created within the main cabinet enclosure 506 for receiving LC nodes 102 (of FIG. 1) into rack 504.

FIG. 6 illustrates an air cooled node 503 that is not connected to a DL subsystem 620 and thus is not provided air-to-liquid cooling capacity of the cooling liquid. The adjacent LC nodes 503 (FIG. 5) are connected via a block liquid manifold/fan module DL assembly 622 for fluid transfer by MLD conduits 624 to form a liquid rail 626 of parallel supply rail 628 and return rail 630. The top-most LC node 503 has upper supply and return ports 632, 634 coupled to long supply and return conduits 636, 638 that connect to a liquid infrastructure node 640. The liquid infrastructure node 640 is also connected to a facility supply and return conduits 642, 644 as well as a pair of MLD conduits 624.

Figure 8:
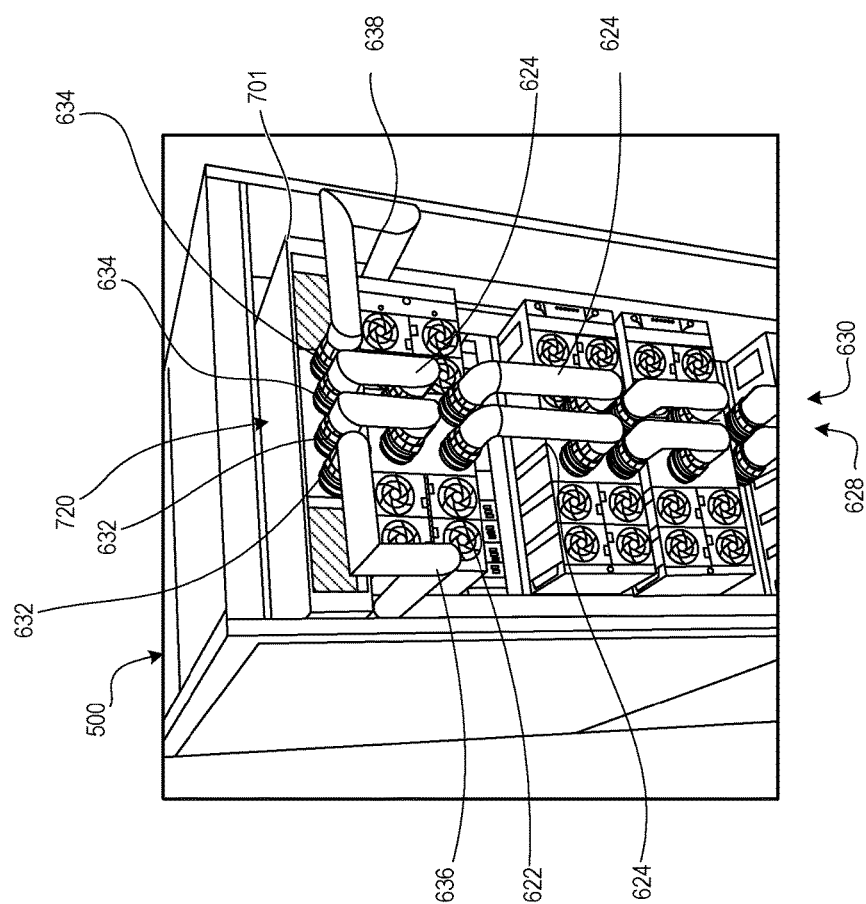
FIG. 8 illustrates a back detail perspective view of the example DL RIHS of FIG. 7, according to one or more embodiments.
Figure 7:
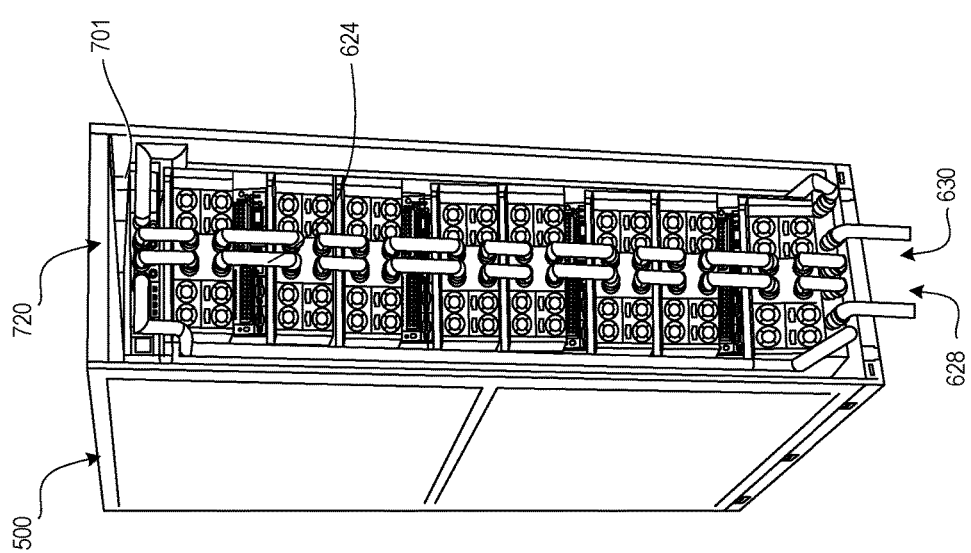
FIG. 7 illustrates a back perspective view of an example DL RIHS having an air-cooled node that uses a DL subsystem for air-to-liquid cooling, according to one or more embodiments.

FIGS. 7-8 are the RIHS 500 with a DL subsystem 722 reconfigured by incorporating a ATLHE block 701 to perform air-to-liquid heat exchange cooling for the air cooled node 503 (FIG. 6). The ATLHE block 701 has an inner, first pair of supply and return ports 632, 634 connected to an adjacent DL assembly 622 by a pair MLD conduits 624 that are part of the supply and return rails 628, 630, respectively. An outer, second pair of supply and return ports 632, 634 of the ATLHE block 701 are connected to the long supply and return conduits 636, 638, respectively.

Figure 9:
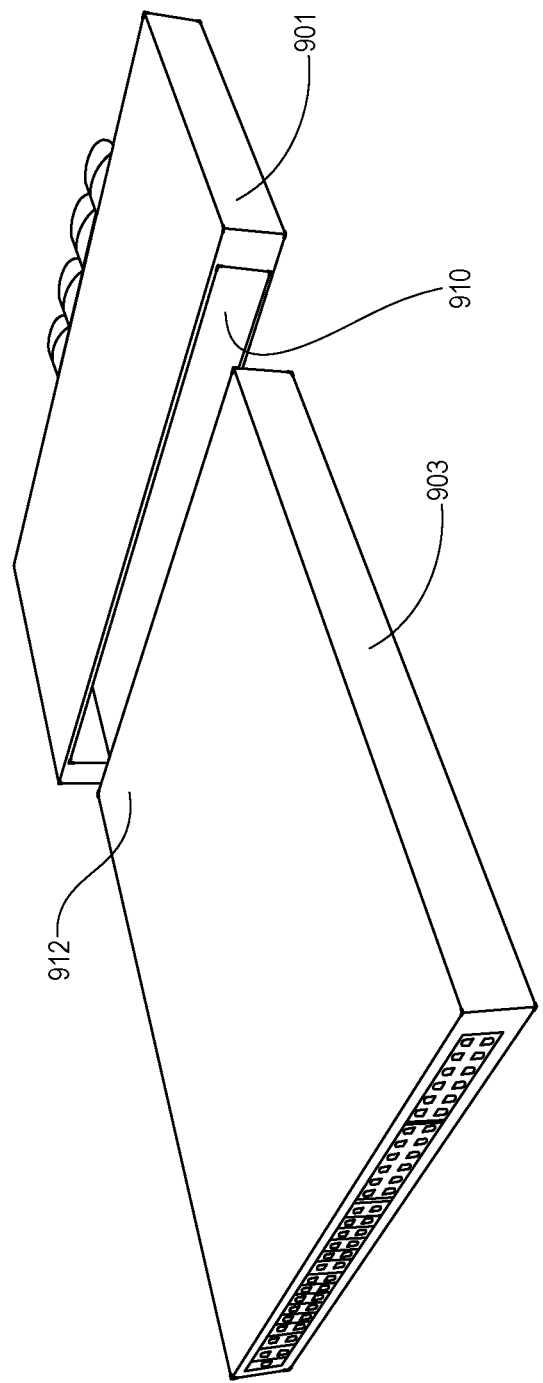
FIG. 9 illustrates a side perspective view of a 1U ATLHE block and a 1U air cooled node, according to one or more embodiments.
Figure 10:
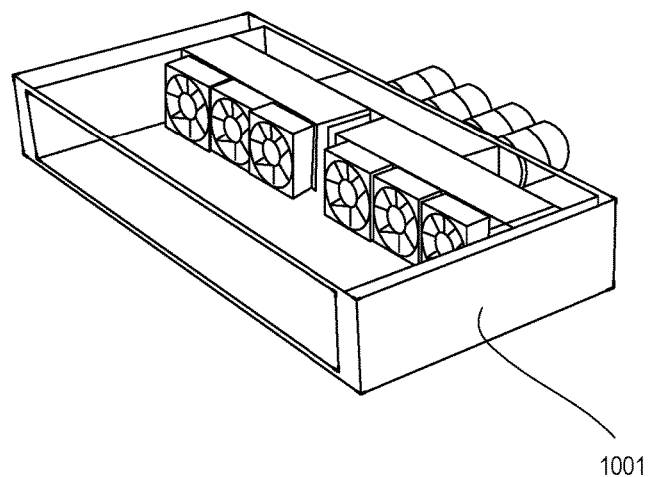
FIG. 10 is a side perspective view of a 2U ATLHE block with a top panel omitted to reveal fan modules, according to one or more embodiments.
Figure 11:
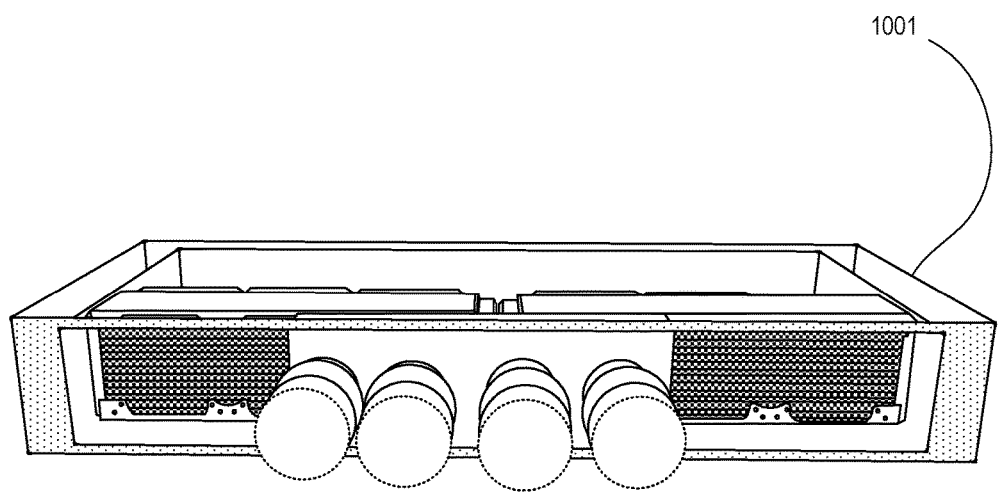
FIG. 11 is a front perspective view of the 2U ATLHE block of FIG. 10, according to one or more embodiments.
Figure 12:
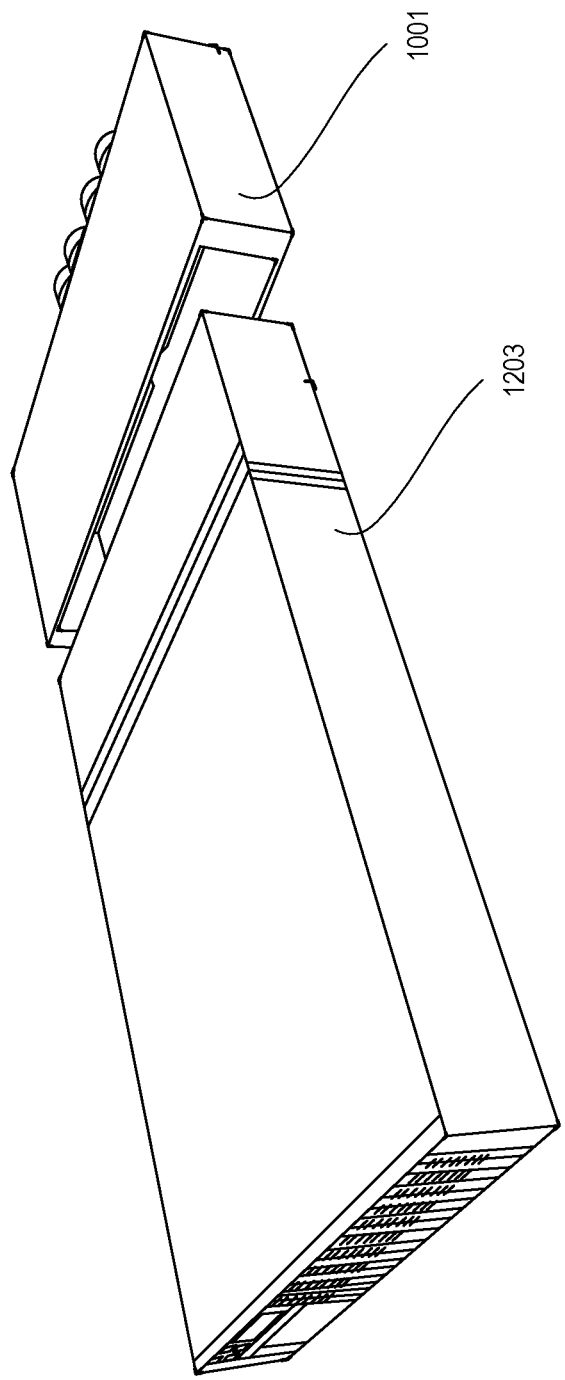
FIG. 12 illustrates a side perspective view of a 2U ATLHE block and a 2U air cooled node, according to one or more embodiments.
Figure 13:
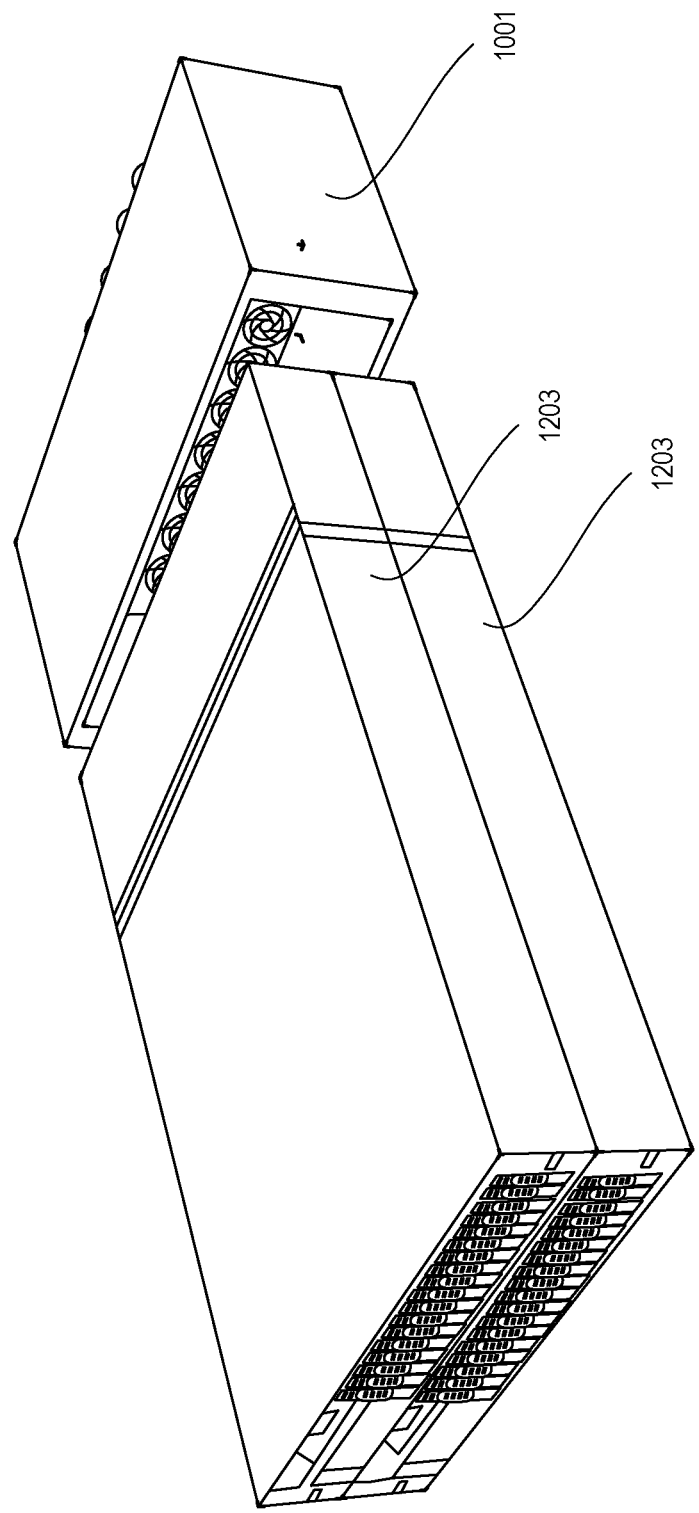
FIG. 13 illustrates a side perspective view of a 4U ATLHE block and two stacked 2U air cooled nodes, according to one or more embodiments.

FIGS. 9 illustrates an example ATLHE block 901 configured for a 1U form factor with a cuboid aperture or cavity 910 to receive an exhaust end 912 of an air-cooled node 903. FIGS. 10-12 illustrate an example ATLHE block 1001 configured to have a 2U form factor to receive a 2U air cooled node 1203(FIG. 12). FIG. 13 illustrates an example ATLHE block 1301 configured to have a 4U form to receive two stacked 2U air cooled nodes 1203.

Figure 14:
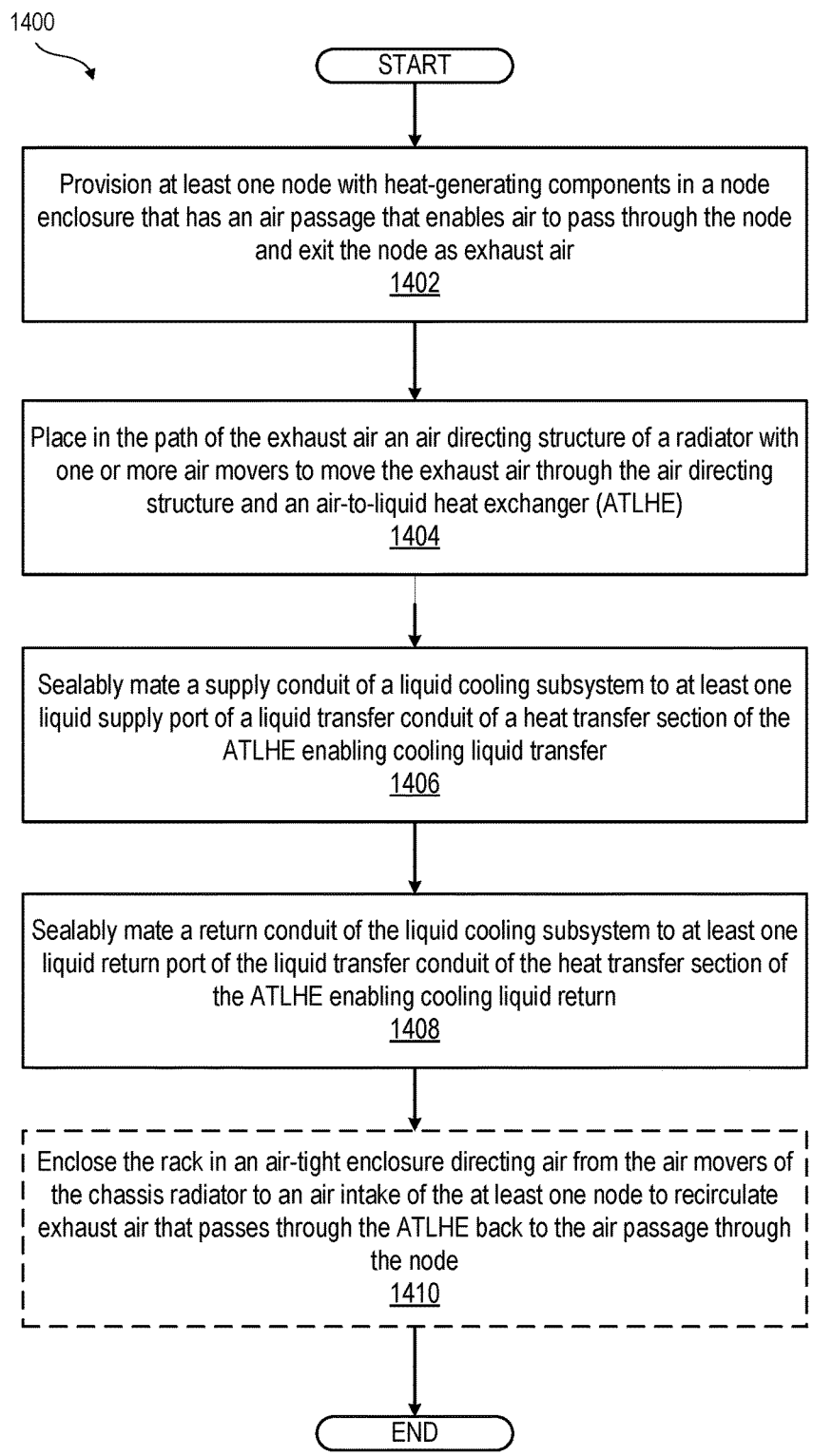
FIG. 14 illustrates a flow diagram of a method of assembling an IHS with a ATLHE block for cooling an air-cooled node, according to one or more embodiments.

FIG. 14 illustrates a method 1400 of assembling an RIHS. The method 1400 includes provisioning at least one node with heat-generating components in a node enclosure. The node enclosure has an air passage that enables air to pass through the node and exit the node as exhaust air (block 1402). The method 1400 includes placing in the path of the exhaust air an air directing structure of a ATLHE block. The ATLHE block has one or more air movers to move the exhaust air through the air directing structure and an air-to-liquid heat exchanger (ATLHE) (block 1404). The method 1400 includes sealably mating a supply conduit of a liquid cooling subsystem to at least one liquid supply port of a liquid transfer conduit of a heat transfer section of the ATLHE enabling cooling liquid transfer (block 1406). The method 1400 includes sealably mating a return conduit of the liquid cooling subsystem to at least one liquid return port of the liquid transfer conduit of the heat transfer section of the ATLHE enabling cooling liquid return (block 1408).

In one or more embodiments, the method 1400 further includes enclosing the rack in an air-tight enclosure directing air from the air movers of the ATLHE block to an air intake of the at least one node to recirculate exhaust air that passes through the ATLHE back to the air passage through the node (block 1410). Thereby a closed-loop air flow is enabled to prevent intake of contaminants and particles from ambient air outside of the RIHS and enabling the cooling liquid to absorb and remove substantially all of the heat generated by the heat-generating components (block 1412). Then method 1400 ends.

Figure 15:
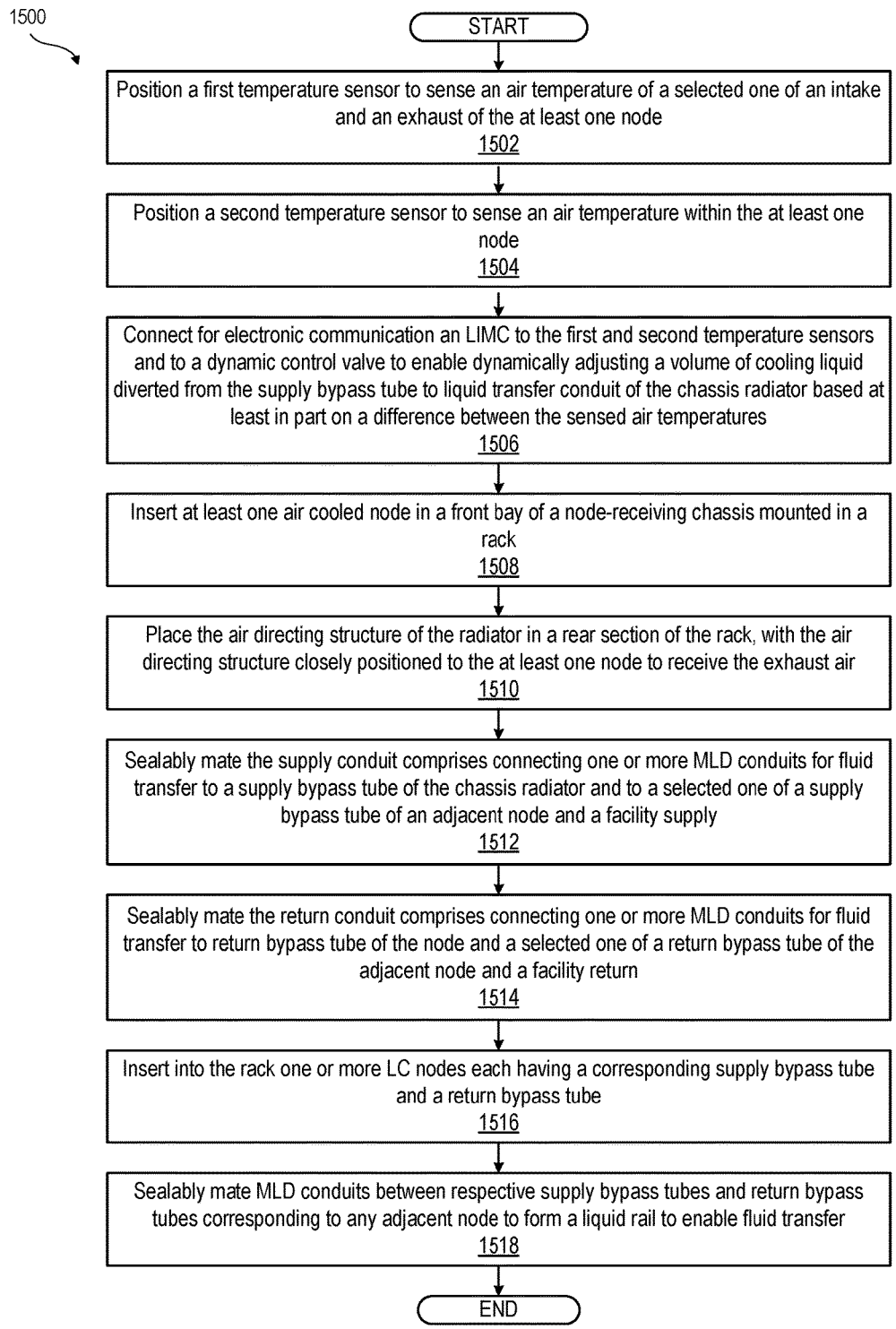
FIG. 15 illustrates a flow diagram of a method of assembling a DL RIHS, according to one or more embodiments.

FIG. 15 illustrates a method 1500 of assembling a DL RIHS that includes LC nodes and at least one air cooled node. In one or more embodiments, the method 1500 includes positioning a first temperature sensor to detect an air temperature of a selected one of an intake and an exhaust of the at least one node (block 1502). The method 1500 includes positioning a second temperature sensor to detect an air temperature within the at least one node (block 1504). The method 1500 includes connecting for electronic communication an LIMC to the first and second temperature sensors and to a dynamic control valve (block 1506). The connections enable the valve to dynamically adjust a volume of cooling liquid diverted from the supply bypass tube to liquid transfer conduit of the ATLHE block based at least in part on a difference between the detected air temperatures.

The method 1500 includes inserting at least one air cooled node in a front bay of a node-receiving chassis mounted in a rack (block 1508). The method 1500 includes placing the air directing structure of the ATLHE block in a rear section of the rack, with the air directing structure closely positioned to the at least one node to receive the exhaust air (block 1510). The method 1500 includes sealably mating the supply conduit comprises connecting one or more MLD conduits for fluid transfer to a supply bypass tube of the ATLHE block and to a selected one of a supply bypass tube of an adjacent node and a facility supply (block 1512). The method 1500 includes sealably mating the return conduit comprises connecting one or more MLD conduits for fluid transfer to return bypass tube of the node and a selected one of a return bypass tube of the adjacent node and a facility return (block 1514). The method 1500 includes inserting into the rack one or more LC nodes each having a corresponding supply bypass tube and a return bypass tube (block 1516). The method 1500 includes sealably mating to enable fluid transfer MLD conduits between respective supply bypass tubes and return bypass tubes corresponding to any adjacent node to form a liquid rail (block 1518). Then method 1500 end.

In the above described flow charts of FIGS. 14-15, the methods may be embodied in an automated manufacturing system that performs a series of functional processes. In some implementations, certain steps of the method are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An Information Handling System (IHS) comprising:
    at least one node provisioned with heat-generating components and having an air passage that enables air to pass through the node and exit the node as exhaust air;
    an air-to-liquid heat exchanger (ATLHE) block placed in a path of the exhaust air, the ATLHE block comprising an air directing structure, one or more air movers to move the exhaust air through the air directing structure, and an air-to-liquid heat exchanger (ATLHE) with a liquid transfer conduit having at least one liquid supply port extending into a heat transfer section, which terminates into at least one liquid return port, the liquid transfer conduit enabling cooling liquid transfer through the ATLHE;
    a liquid cooling subsystem comprising a supply conduit and a return conduit, the supply conduit sealably mated to the at least one supply port and the return conduit sealably mated to the at least one return port; and
    a liquid infrastructure management controller (LIMC) in communication with a first and a second temperature sensor and a dynamic control valve to dynamically adjust a volume of cooling liquid, based at least in part on a difference between the detected air temperatures, to provide sufficient heat transfer from the node via cooling liquid absorption of heat from the exhaust air circulating through the ATLHE block.

2. The IHS of claim 1, wherein the node provides an exhaust end through which the exhaust air exits the node and the ATLHE block is aligned in fluid communication with the exhaust end.

3. The IHS of claim 1, further comprising a rack having one or more chasses for receiving nodes, wherein the node is inserted into a front bay of a chassis, wherein the ATLHE block is received in a rear section of the rack at back of the chassis, with the air directing structure closely positioned to the at least one node to receive the exhaust air.

4. The IHS of claim 3, wherein:
    the ATLHE block comprises:
        a supply bypass tube and a return bypass tube; and
        a dynamic control valve that directs a portion of cooling liquid from the supply bypass tube through the ATLHE and to the return bypass tube;
    the supply conduit comprises one or more modular liquid distribution (MLD) conduits that connect for fluid transfer to the supply bypass tube of the ATLHE block and to a selected one of a supply bypass tube corresponding to an adjacent node and a facility supply; and
    the return conduit comprises one or more MLD conduits that connect for fluid transfer to the return bypass tube of the node and a selected one of a return bypass tube corresponding to the adjacent node and a facility return.

5. The IHS of claim 4, further comprising one or more liquid cooled (LC) nodes arranged in the rack where each LC node includes a supply bypass tube and a return bypass tube connected to another adjacent node by MLD conduits, wherein a plurality of MLD conduits connected across a plurality of nodes form a liquid rail.

6. The IHS of claim 3, wherein the cooling liquid flowing through the ATLHE absorbs and removes substantially all of the heat generated by the heat-generating components and the IHS further comprises an air-tight enclosure associated with the at least one node and the ATLHE block and having a return structure directing air from the air movers of the ATLHE block towards an air intake of the at least one node to recirculate exhaust air that passes through and is cooled by the ATLHE back to the air passage through the node, wherein the air-tight enclosure provides a closed-loop air flow, which substantially minimizes intake of air-born contaminants and particles from ambient air outside of the RIHS.

7. The IHS of claim 6, further comprising:
    a dynamic control valve that directs at least a portion of cooling liquid from a facility supply through the at least one liquid supply port;

a first temperature sensor positioned to detect an air temperature at one of a return path to the intake and the intake of the at least one node, which air temperature correlates to a temperature of cooled exhaust air exiting the ATLHE; and
a second temperature sensor positioned to detect an air temperature within the at least one node.

8. The IHS of claim 1, further comprising:
a dynamic control valve that directs at least a portion of cooling liquid from a facility supply through the at least one liquid supply port;
a first temperature sensor positioned to detect an air temperature of a selected one of an intake and an exhaust of the at least one node;
a second temperature sensor positioned to detect a hottest air temperature within the at least one node;
a liquid infrastructure management controller (LIMC) in communication with the first and second temperature sensors and the dynamic control valve to dynamically adjust a volume of cooling liquid based at least in part on a difference between the detected air temperatures.

9. The IHS of claim 1, wherein the air directing structure of the ATLHE block is configured with a form factor to receive at least two nodes.

10. The IHS of claim 1, wherein the air directing structure of the ATLHE block is configured with a form factor to receive at least 1 node.

11. The IHS of claim 1, wherein:
the at least one node comprises a cuboid-shaped node enclosure with an exhaust end;
the air directing structure comprises a cuboid-shaped cavity having an open end dimensioned to closely receive the exhaust end of the cuboid-shaped node-enclosure;
the one or more air movers comprises fan modules received in an opposing side of the ATLHE block from the open end of the air directing structure; and
the ATLHE is traversely positioned inside the air directing structure between the fan modules and the exhaust end of the one or more nodes.

12. An air-to-liquid heat exchanger (ATLHE) block for use in a liquid cooled rack information handling system (RIHS) having at least one air-cooled node with heat generating components, the ATLHE block comprising:
an air directing structure at a front portion of the ATLHE block;
one or more air movers positioned at a back section of the ATLHE block and which moves exhaust air through the air directing structure;
an air-to-liquid heat exchanger (ATLHE) having a cooling liquid transfer conduit configured with at least one liquid supply port for sealably mating with a supply side conduit of a liquid cooling supply subsystem, the supply port extending into a heat transfer section of conduit providing direct surface exposure to the exhaust air received into the air directing structure and which terminates into at least one liquid return port for sealably mating with a return side conduit of the liquid cooling supply system, the liquid transfer conduit enabling cooling liquid transfer through the ATLHE to absorb heat from the exhaust air directed through the ATLHE; and
one or more rack-connecting affordances that enables secure connection of the ATLHE block to a back of rack behind a node-receiving chassis and in front of a liquid cooling subsystem conduits, wherein the air directing structure is closely positioned to an exhaust end of at least one node to receive the exhaust air.

13. The ATLHE block of claim 12, wherein the at least one liquid supply port and liquid return port are configured to receive and mate to a modular liquid distribution (MLD) conduit within a liquid rail structure of the liquid cooling supply system.

14. The ATLHE block of claim 12, wherein the cooling liquid flowing through the ATLHE absorbs and removes substantially all of the heat generated by heat-generating components and the ATLHE block is sealed to an air-tight air return enclosure associated with at least one node and having a return structure directing air from the air movers of the ATLHE block towards an air intake of the at least one node to recirculate exhaust air that passes through and is cooled by the ATLHE back to an air passage through the node, wherein the sealing to the air-tight air enclosure enables configuration of the ATLHE block for a closed-loop air flow, which substantially minimizes intake of air-born contaminants and particles from ambient air outside of the RIHS.

15. A method of assembling an Information Handling System (IHS) comprising:
provisioning at least one node with heat-generating components in a node enclosure having an air passage that enables air to pass through the node and exit the node as exhaust air;
placing in the path of the exhaust air an air directing structure of an air-to-liquid heat exchanger (ATLHE) block having one or more air movers to move the exhaust air through the air directing structure and an ATLHE;
sealably mating a supply conduit of a liquid cooling subsystem to at least one liquid supply port of a liquid transfer conduit that extends through a heat transfer section of the ATLHE to enable cooling liquid transfer through the ATLHE; and
sealably mating a return conduit of the liquid cooling subsystem to at least one liquid return port of the liquid transfer conduit to enable cooling liquid return, wherein sealably mating the return conduit comprises connecting one or more modular liquid distribution (MLD) conduits for fluid transfer to a return bypass tube of the ATLHE block and a selected one of a return bypass tube of the adjacent node and a facility return.

16. The method of claim 15, further comprising:
inserting the at least one node in a front bay of a chassis mounted in a rack; and
placing the air directing structure of the ATLHE block in a rear section of the rack, with the air directing structure closely positioned to the at least one node to receive the exhaust air.

17. The method of claim 15, wherein:
sealably mating the supply conduit comprises connecting one or more modular liquid distribution (MLD) conduits for fluid transfer to a supply bypass tube of the ATLHE block and to a selected one of a supply bypass tube of an adjacent node and a facility supply.

18. The method of claim 17, further comprising:
inserting into the rack one or more liquid cooled (LC) nodes each having a corresponding supply bypass tube and a return bypass tube; and
sealably mating, for fluid transfer, MLD conduits between respective supply bypass tubes and return bypass tubes corresponding to adjacent nodes to form a liquid rail.

19. The method of claim 15, wherein the cooling liquid flowing through the ATLHE absorbs and removes substantially all of the heat generated by the heat-generating components and the method further comprises enclosing the at least one node and ATLHE block in an air-tight enclosure associated with the at least one node and the ATLHE block and having a return structure directing air from the air movers of the ATLHE block towards an air intake of the at least one node to recirculate exhaust air that passes through and is cooled by the ATLHE back to the air passage through the node, wherein the air-tight enclosure provides a closed-loop air flow, which substantially minimizes intake of airborne contaminants and particles from ambient air outside of the RIHS.

20. The method of claim 15, further comprising:
positioning a first temperature sensor to detect an air temperature of a selected one of an intake and an exhaust of the at least one node;
positioning a second temperature sensor to detect an air temperature within the at least one node; and
connecting, for electronic communication, a liquid infrastructure management controller (LIMC) to the first and second temperature sensors and to a dynamic control valve that dynamically adjusts a volume of cooling liquid diverted from the supply bypass tube to liquid transfer conduit of the ATLHE block based at least in part on a difference between the detected air temperatures.

* * * * *